United States Patent
Li et al.

(10) Patent No.: US 8,262,250 B2
(45) Date of Patent: Sep. 11, 2012

(54) MODULAR LED LIGHTING SYSTEMS AND FLEXIBLE OR RIGID STRIP LIGHTING DEVICES

(75) Inventors: Qing Charles Li, Blacksburg, VA (US); Weiping Li, Foshan (CN); Qingyue Zuo, Foshan (CN); Yihang Pan, Foshan (CN)

(73) Assignees: Virginia Optoelectronics, Inc., Blacksburg, VA (US); Foshan Nationstar Optoelectronics Co., Ltd. Corp. (CN)

( * ) Notice: Subject to any disclaimer, the term of this patent is extended or adjusted under 35 U.S.C. 154(b) by 421 days.

(21) Appl. No.: 12/499,306

(22) Filed: Jul. 8, 2009

(65) Prior Publication Data

US 2010/0008090 A1     Jan. 14, 2010

Related U.S. Application Data

(60) Provisional application No. 61/079,042, filed on Jul. 8, 2008.

(51) Int. Cl.
*F21S 4/00*     (2006.01)
(52) U.S. Cl. ............... 362/219; 362/249.02; 362/249.04
(58) Field of Classification Search .................. 362/219, 362/249.02, 249.04, 249.08
See application file for complete search history.

(56) References Cited

U.S. PATENT DOCUMENTS

| | | | |
|---|---|---|---|
| 4,173,035 | A | 10/1979 | Hoyt |
| 4,479,686 | A | 10/1984 | Hoshino et al. |
| 5,788,520 | A | 8/1998 | Roche |
| 5,848,837 | A | 12/1998 | Gustafson |

(Continued)

FOREIGN PATENT DOCUMENTS

CN     201000001Y     1/2008

(Continued)

OTHER PUBLICATIONS

Flex Connectors User's Guide, Osram Sylvania, Oct. 2007.

*Primary Examiner* — Thomas Sember
(74) *Attorney, Agent, or Firm* — New River Valley IP Law; Michele L. Mayberry

(57) ABSTRACT

The present invention relates to lighting strips and more particularly to modular lighting systems comprising lighting devices, for example, lighting strips, physically and electrically connectable with one another by way of a plug and socket integrally formed at opposing ends of the lighting strips. The lighting strip devices can be made of flexible material to allow for applying the lighting devices along flat as well as contoured surfaces. The lighting strips can also be rigid. More particularly, embodiments of the invention include modular lighting strips comprising: a non-conductive substrate strip comprising an electrical circuit; a plurality of light sources operably connected to the electrical circuit; a plug integrally formed at an end of the substrate strip; and a socket integrally formed at an opposing end of the substrate strip; wherein the plug and socket provide for removable, friction-fit, latch or latchless, and electrical interconnection of two or more circuits. Also included in the invention are connector assemblies comprising the inventive socket and plugs integral to PCBs for use in the field of electronics. One or more lighting strip can be combined to form lighting systems, which are useful in many functional and decorative lighting applications. The lighting systems are useful for any residential or commercial application where modular, discrete, low-profile, and/or flexible lighting is desired. The lighting strips of the invention can be used in particular for back lighting, accent lighting, aisle or path lighting, contour lighting, elegant interior decoration, holiday decorations, or landscape lighting.

24 Claims, 21 Drawing Sheets

U.S. PATENT DOCUMENTS

| | | |
|---|---|---|
| 5,944,547 A | 8/1999 | Golab et al. |
| 6,579,107 B1 | 6/2003 | Sanroma |
| 6,673,293 B1 | 1/2004 | Mistopoulos et al. |
| 7,114,247 B2 | 10/2006 | Swantner et al. |
| 7,210,818 B2 | 5/2007 | Luk et al. |
| 7,374,457 B1 | 5/2008 | Oksengendler et al. |
| 2008/0094828 A1* | 4/2008 | Shao .................. 362/219 |

FOREIGN PATENT DOCUMENTS

| | | |
|---|---|---|
| CN | 201021793Y | 2/2008 |
| CN | 201053600Y | 4/2008 |
| CN | 201145159Y | 11/2008 |

* cited by examiner

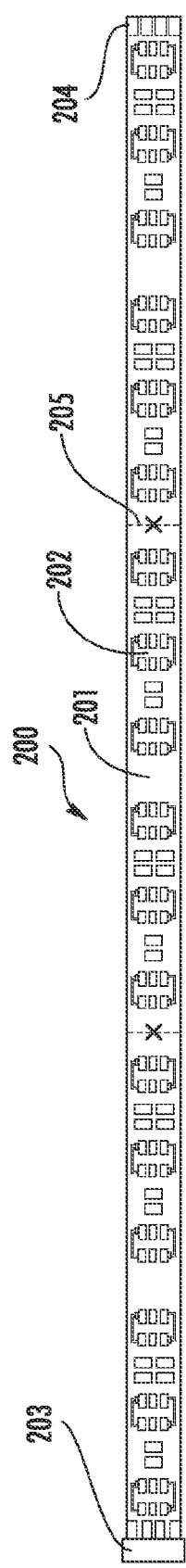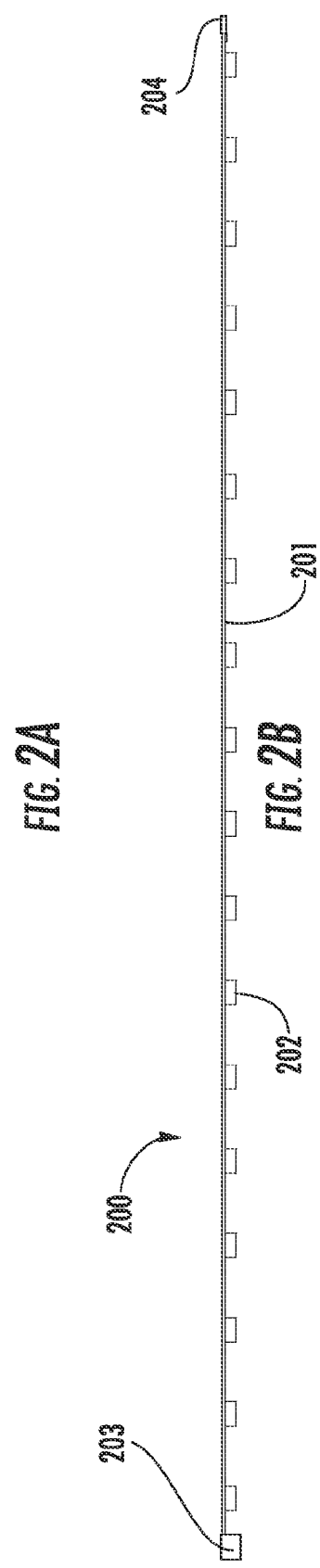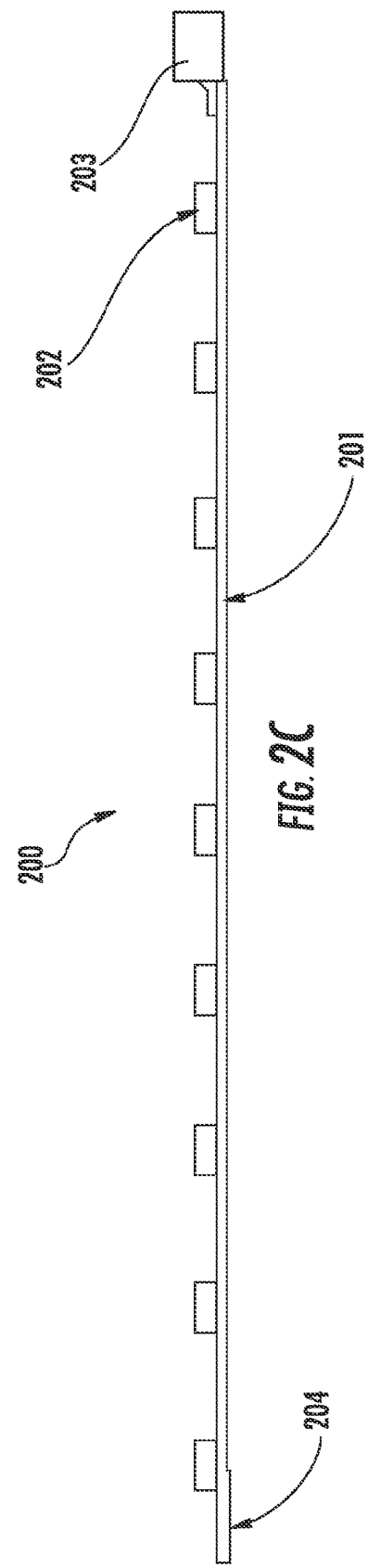

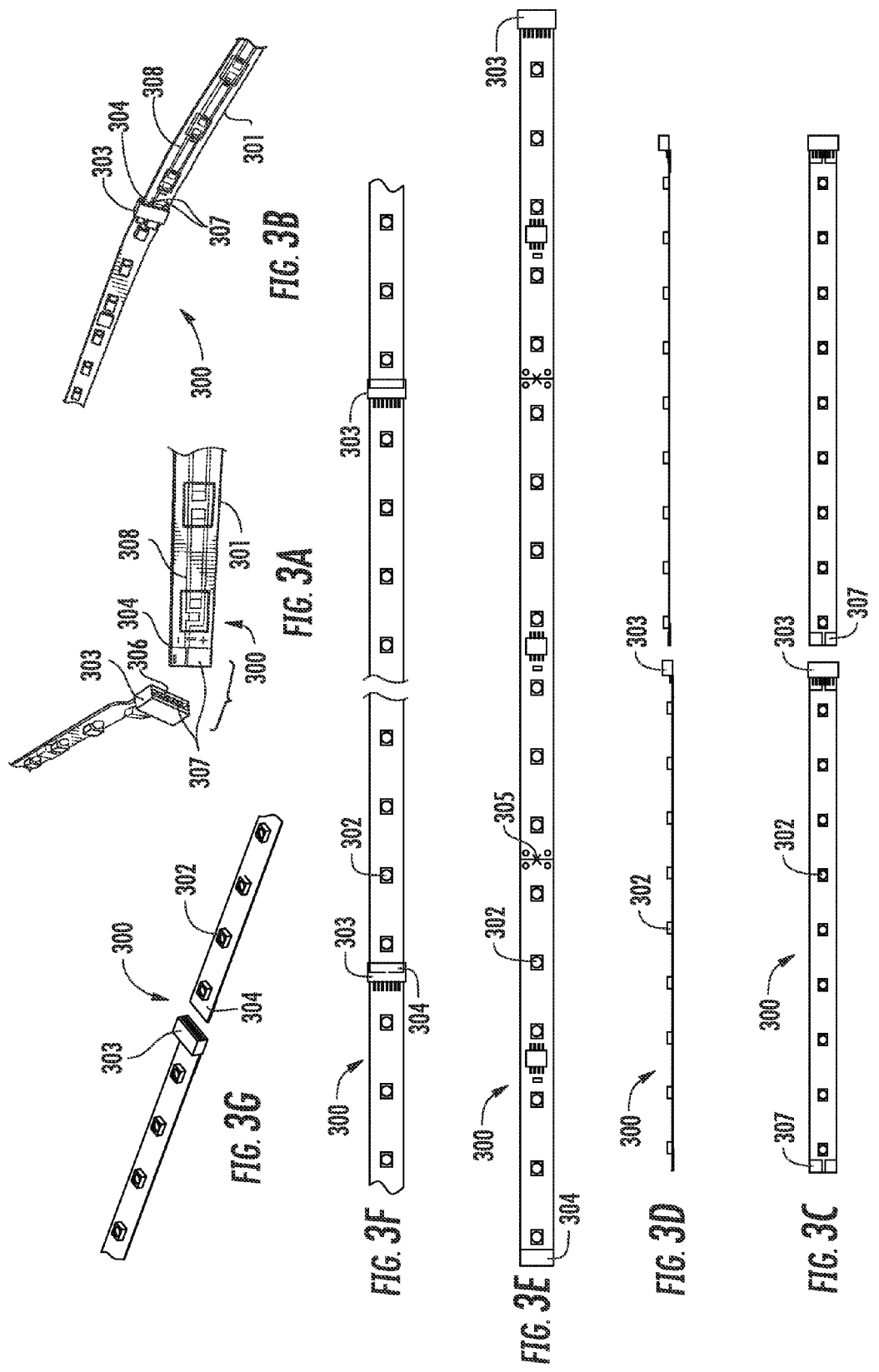

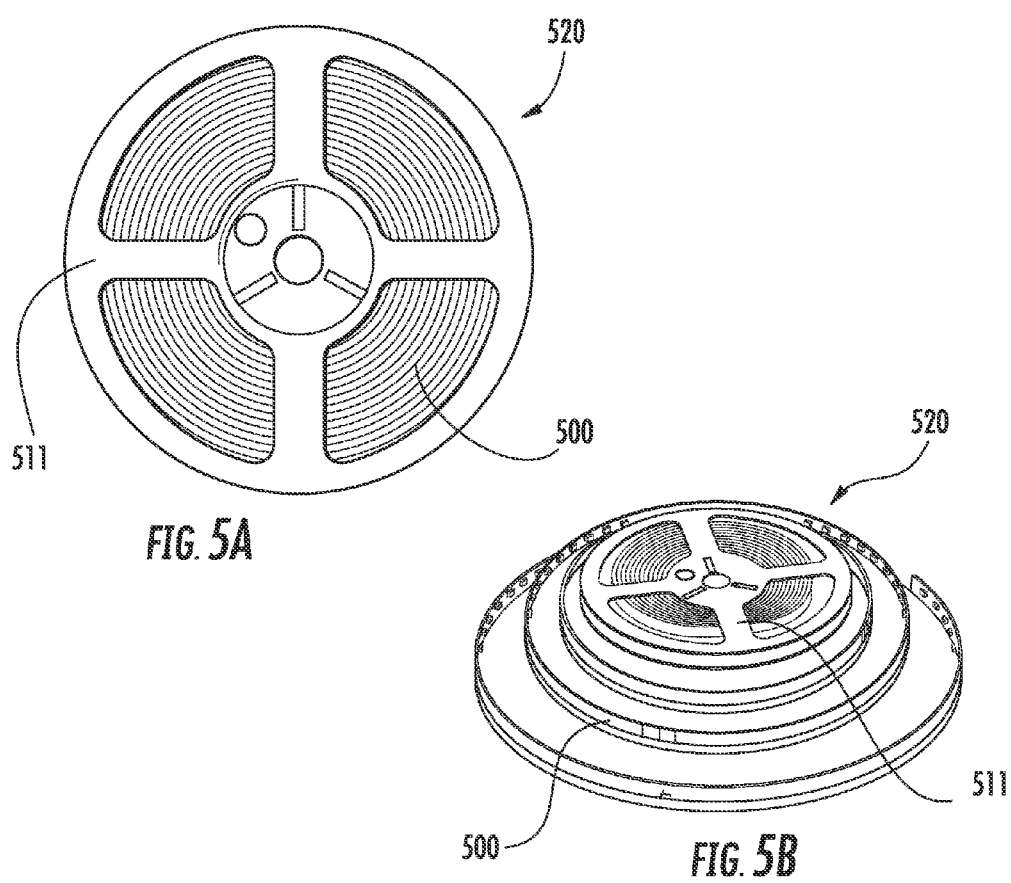

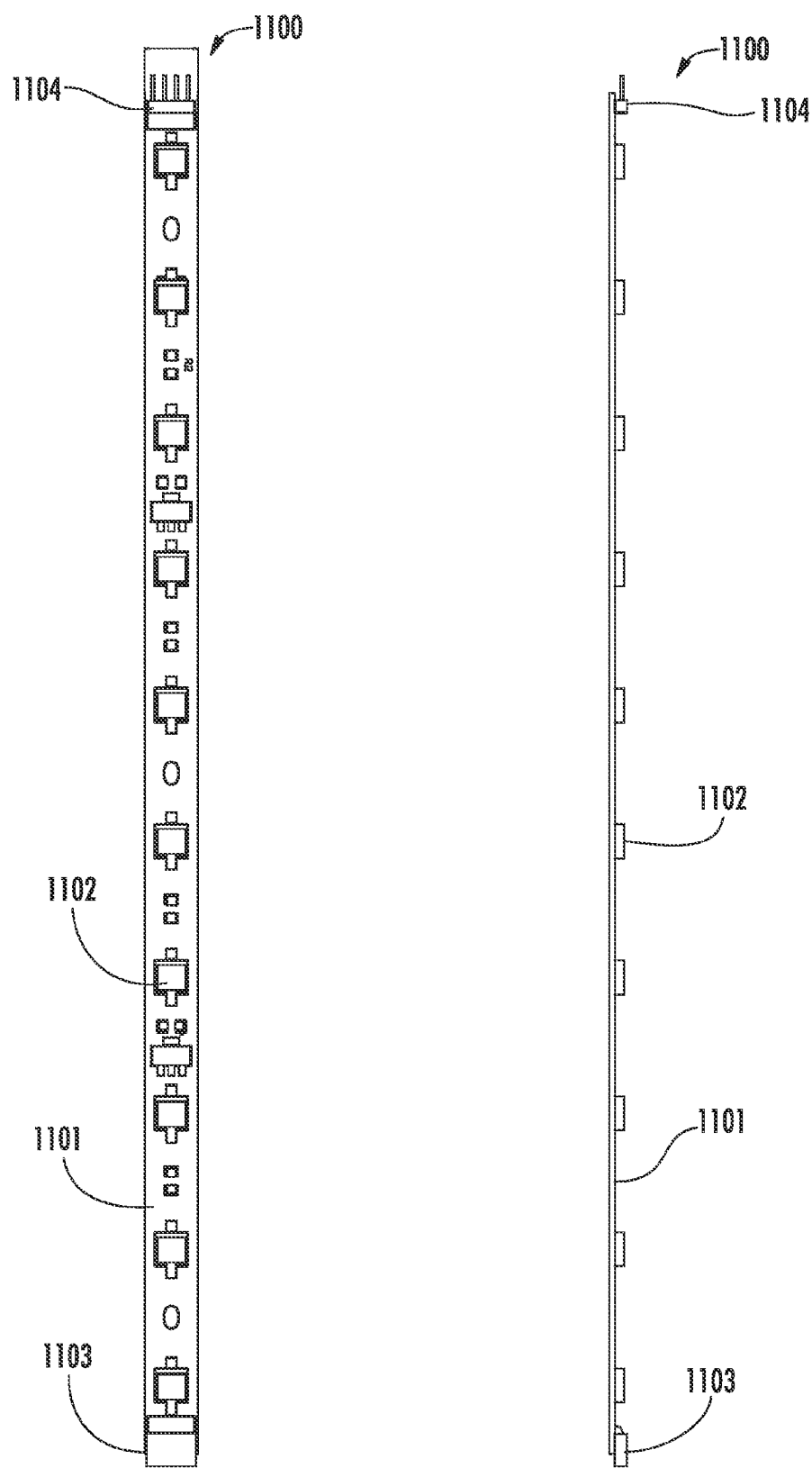

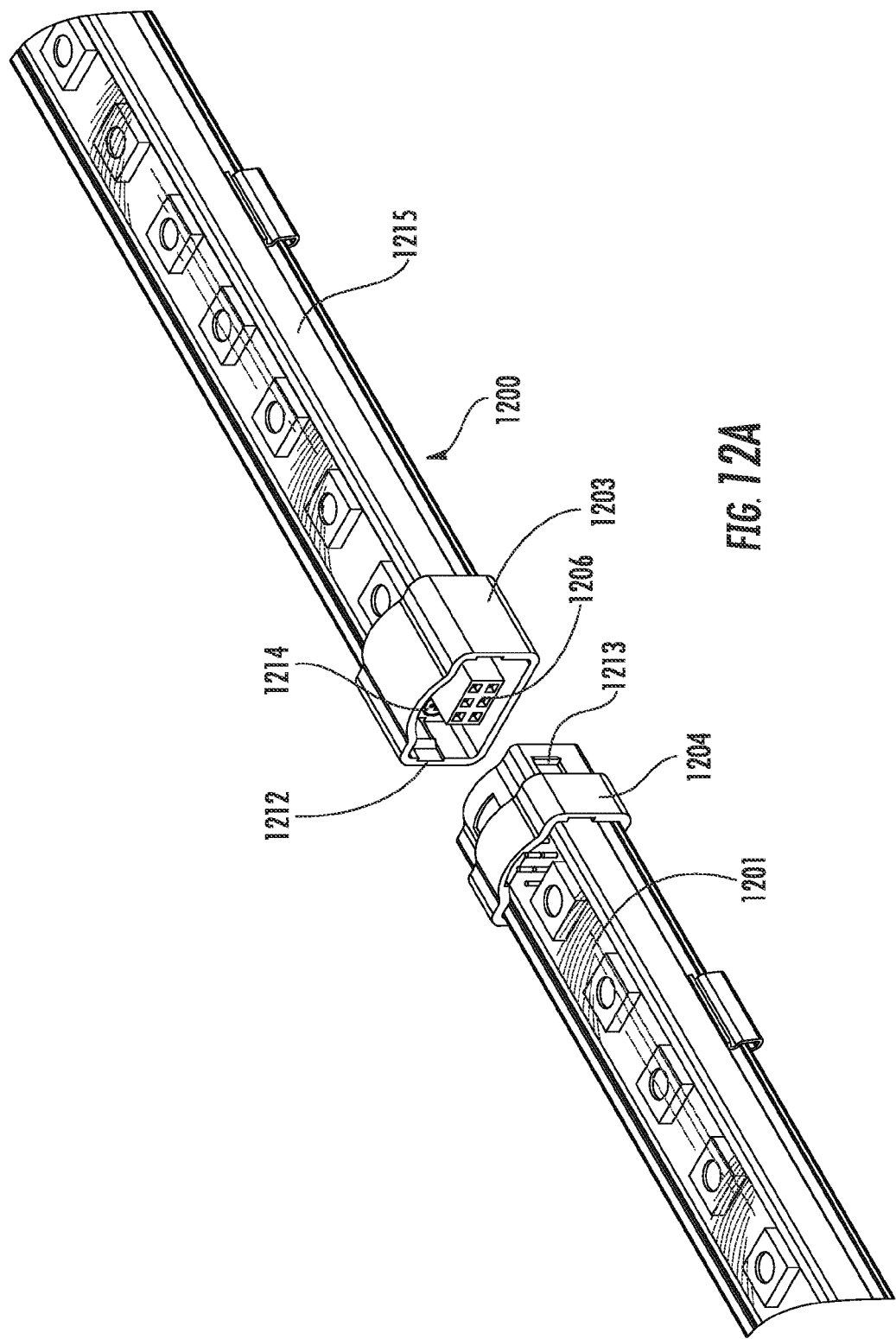

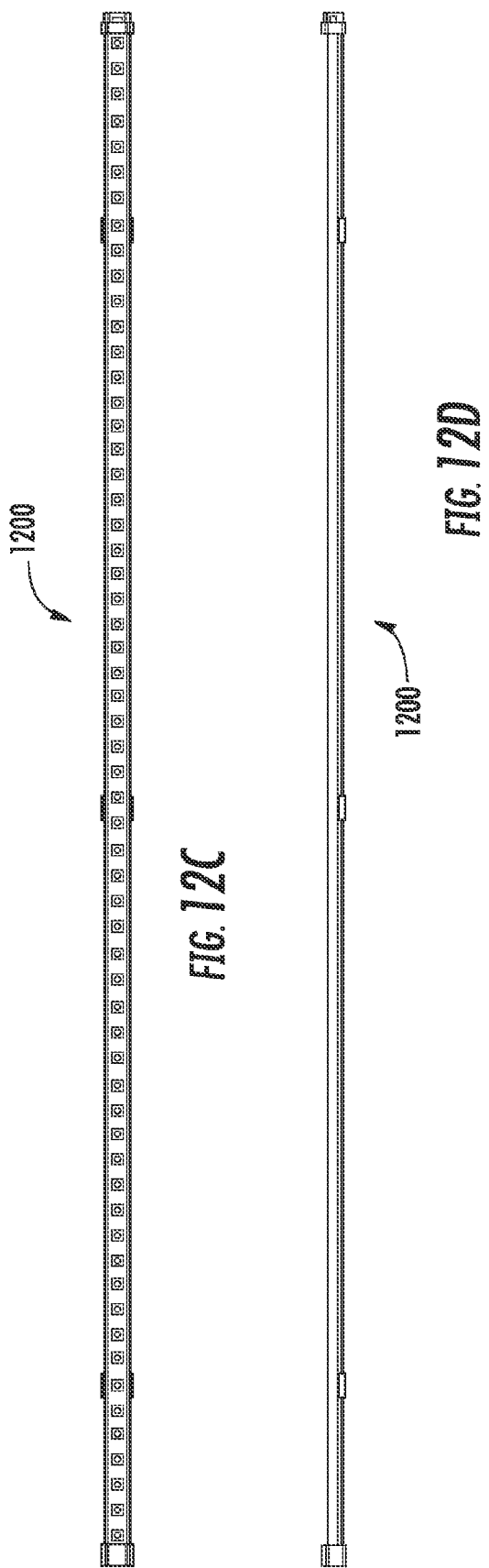

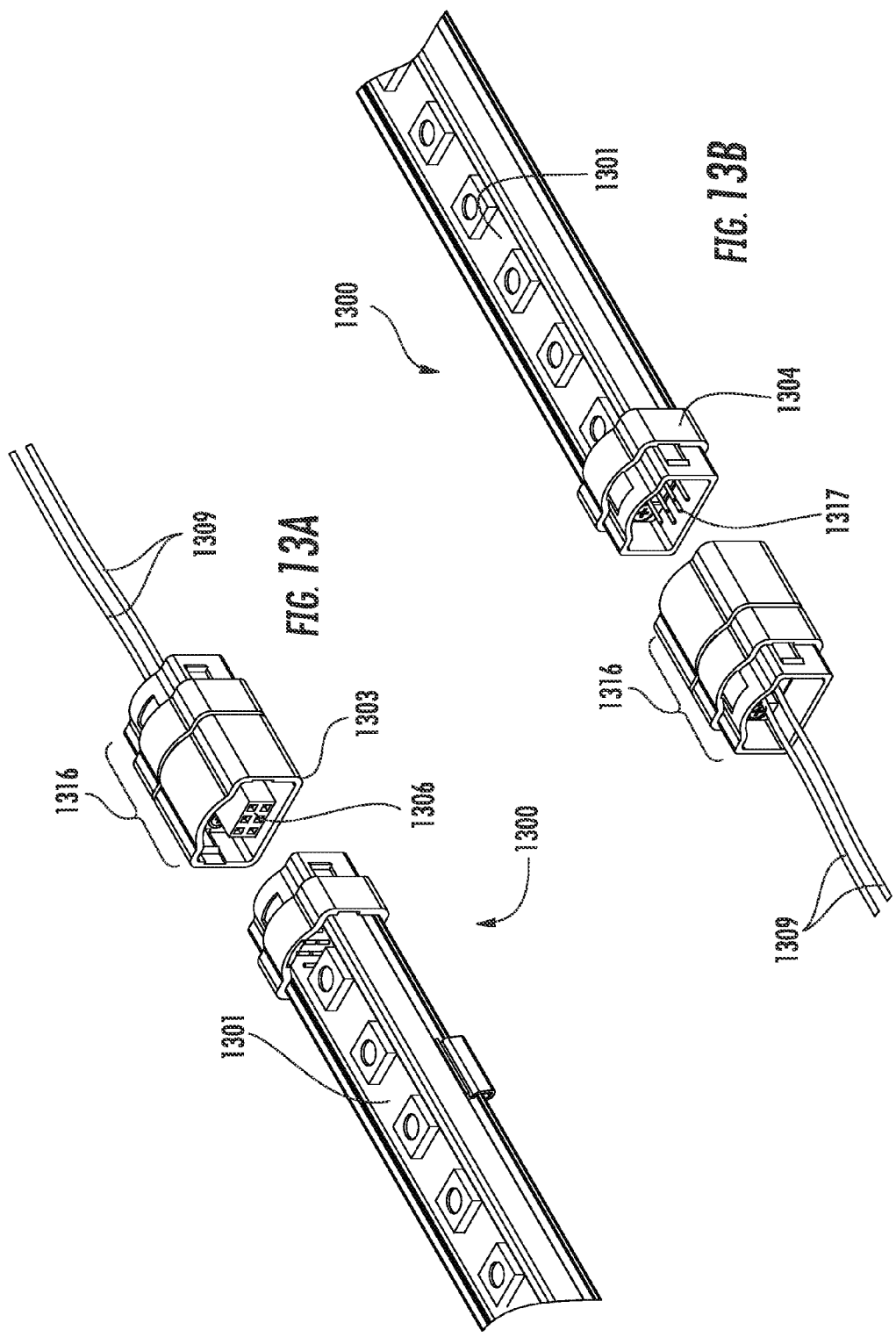

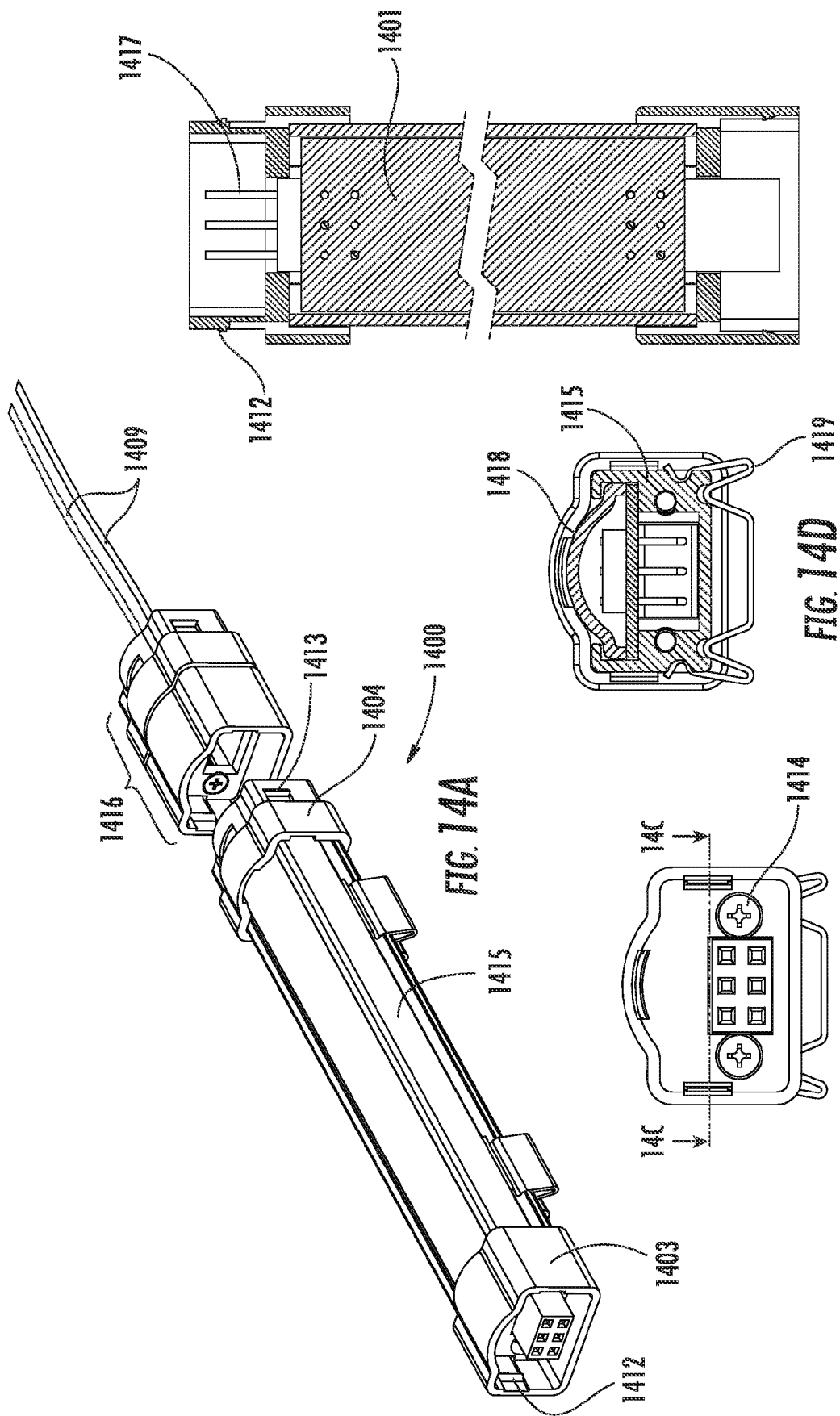

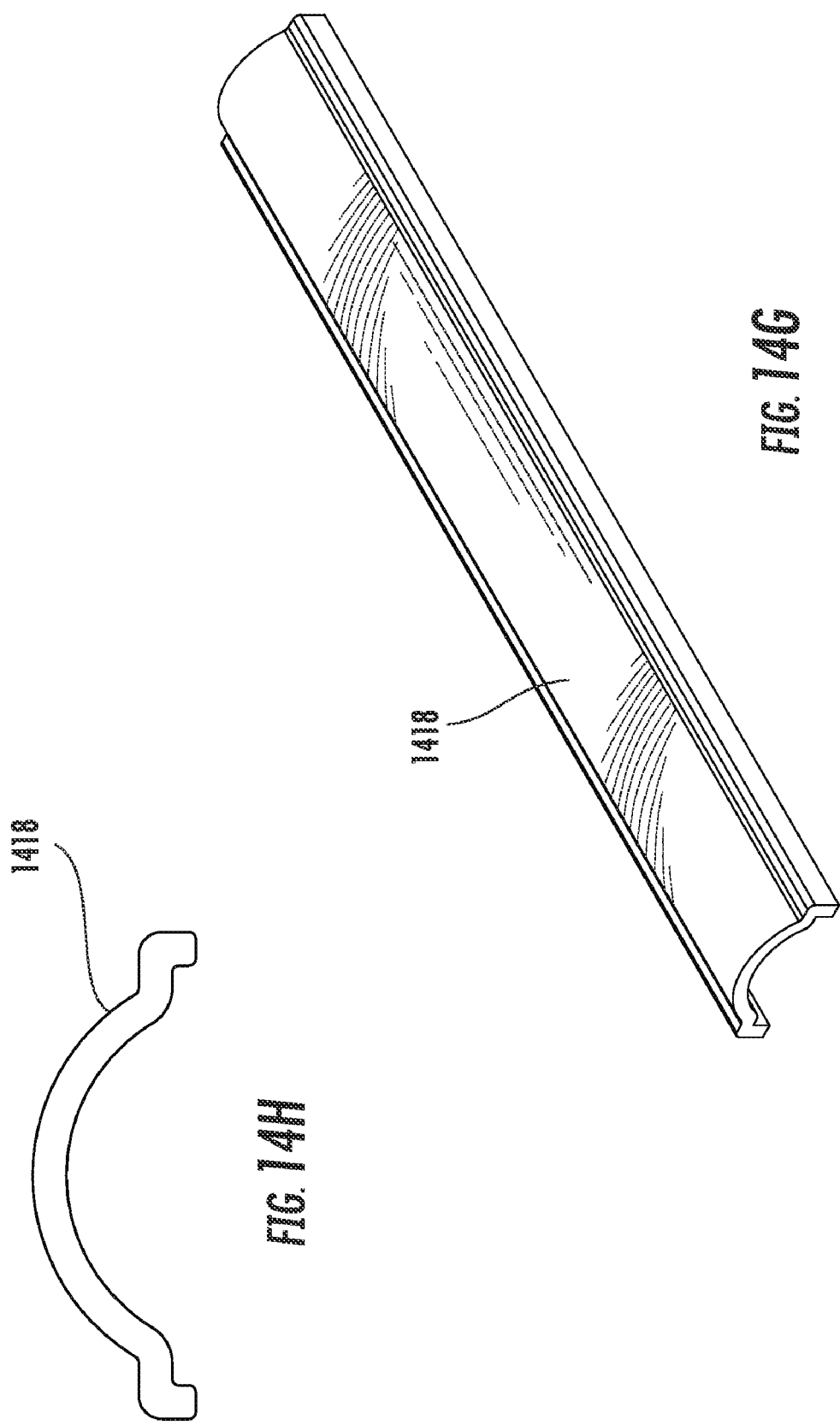

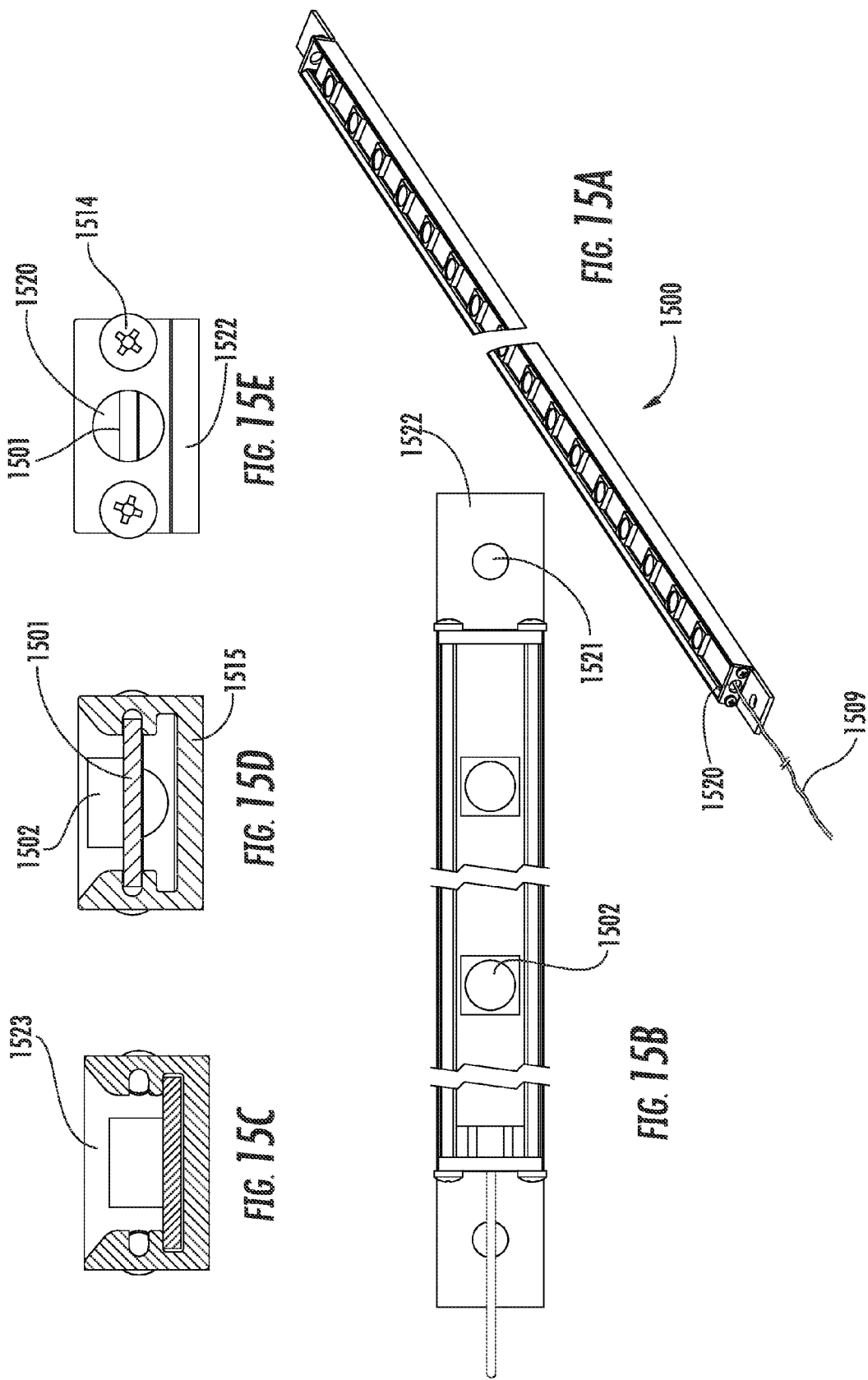

MODULAR LED LIGHTING SYSTEMS AND FLEXIBLE OR RIGID STRIP LIGHTING DEVICES

CROSS-REFERENCE TO RELATED APPLICATIONS

This application relies on the disclosure and claims the benefit of the filing date of U.S. Provisional Application No. 61/079,042 filed Jul. 8, 2008, the disclosure of which is hereby incorporated by reference in its entirety.

BACKGROUND OF THE INVENTION

1. Field of the Invention

The present invention relates to lighting strips and more particularly to modular lighting systems comprising lighting devices, for example, lighting strips, physically and electrically connectable with one another by way of a plug and socket integrally formed at opposing ends of the lighting strips. The lighting strip devices can be made of flexible material to allow for applying the lighting devices along flat as well as contoured surfaces. The lighting strips can also be rigid.

2. Description of the Related Art

Modular strip lighting is highly desirable for numerous applications, including as decorative lighting in commercial settings where the lighting is installed for discrete display, especially on contoured surfaces. Often times, such lighting is hidden from view to provide an indirect, softer light source. It is, however, time consuming and difficult to install or repair lighting in places where the technician may not be able to observe where and how the lighting components are installed, but instead must rely only on his hands in the placement of the components. This conflicts tremendously, however, with the desire to minimize downtime for installation and repair of such systems so as not to disrupt the operating schedule of a particular commercial establishment. Further, some types of installations would be impossible to perform in certain circumstances or otherwise extremely time consuming so as not to warrant the repair or installation.

Some existing strip lighting devices and systems provide for installation and repair of sections of flexible lighting strips by providing two cutting points in the strip where the strip can be cut then spliced with a replacement section by using two discrete connectors to connect the ends of the replacement piece to the previously installed lighting strip where the section was removed. As can be imagined, it is especially difficult if not impossible to make this kind of repair in places where the technician can only use his hands, not his eyes, during the repair. For example, without a visual inspection it would be very difficult to determine where to make the needed cuts. Instead, a larger section of the lighting most likely would have to be removed from its point of installation, repaired, and then re-installed, which is burdensome and takes more time leading to longer repair times.

For low-profile lighting in hard to reach places, it is cumbersome for the technician to orient the individual connectors in the correct position without visual assistance because the connectors are often too tiny to be able to discern surface differences with only the fingers. For example, some known connectors have small prongs or plugs projecting from the connector which require alignment with small holes in the socket portion of the lighting strip for proper installation. Determining proper alignment in these cases is often difficult and time consuming.

Additionally, known strip lighting systems use connectors that have either two plugs or two sockets. These plug-type connectors will mate with either end of a strip lighting device with complementary socket-type ends. Likewise, these socket-type connectors will mate with either end of a strip lighting device with complementary plug-type ends. Thus, these types of known connectors have two junctions where the circuit of the lighting strip can be connected and disconnected. Having multiple junctions, however, can increase the opportunity for lighting failures, as each junction provides a place where the circuit can be broken, e.g., when the components become loose over time and ultimately disconnected. Accordingly, there is a need to reduce the number of components in strip lighting systems, which in turn provides the advantage that the number of physical and electrical connections in the system is also reduced, which in turn reduces the chance of failure of the entire lighting system by reducing the number of possible failure points. Likewise, the amount of time needed for troubleshooting such types of lighting strip failures is proportional to the number of components in the system, so reducing the number of components can save on repair troubleshooting time.

What is needed is a modular, lighting system that is easy and quick to install and repair and provides less opportunity for lighting system failures by providing fewer electrical and physical breaks in the circuit of the lighting system.

SUMMARY OF THE INVENTION

In light of the problems described above, embodiments of the present invention provide flexible or rigid strip lighting devices that can be combined and conveniently interconnected to form modular lighting systems. Embodiments comprising flexible lighting strips are additionally readily adaptable at the time of installation for various applications and can be repaired quickly and easily when light source failures occur or changes to the lighting system are desired.

Should one or more LED of a lighting strip in a lighting system fail or otherwise need to be replaced, the entire strip can be removed easily from the system and a new or replacement strip can be inserted in its place. No additional components, such as socket- or plug-type connectors, are needed. Thus, repairs to previously installed lighting can be performed quickly and easily without cutting the installed strip, and/or without measuring a replacement section for the precise length of lighting strip needed for a repair, and/or without fumbling with additional component pieces for re-establishing the circuit.

Included in embodiments of the invention are modular lighting strips comprising: a non-conductive substrate strip comprising an electrical circuit; a plurality of light sources operably connected to the electrical circuit; a plug integrally formed at an end of the substrate strip; and a socket integrally formed at an opposing end of the substrate strip; wherein the plug and socket provide for removable, friction-fit, latchless, and electrical interconnection of two or more circuits. Embodiments of the invention can comprise a latch-type securing mechanism, preferably releasable, for securing the connection between lighting strips when installed but also allowing for convenient disengagement of the components for repairs.

The modular lighting strips of embodiments of the invention can comprise a printed circuit board, such as a flexible printed circuit board, as the substrate strip and electrical circuit. The overall lighting strip can be flexible or inflexible depending on the materials used for construction. For example, the lighting strips can comprise a printed circuit board (PCB) on an inflexible or flexible material, wherein the PCB is supported or not supported by a rigid material, such as a support with heat sink capabilities.

Additional embodiments include modular lighting strips, wherein: the substrate strip is flexible or inflexible; the light sources are light emitting diodes (LEDs); the plug is formed by electrical contacts mounted to an end of the substrate strip and operably connected to the electrical circuit; and the socket is mounted to an opposing end of the substrate strip and comprises a plug hole with internal electrical contacts operably connected to the electrical circuit; wherein the plug and plug hole are oriented lengthwise in relation to the substrate strip and have complementary shapes to provide for interconnection of two or more substrates. Embodiments also include plugs and plug holes that provide for co-planar, parallel, or perpendicular interconnection of the substrates, including any plug and plug hole orientation relative to the substrate.

Further included in the invention are modular lighting strips having a low profile appearance, for example, with a height of less than about 3 mm.

It is also possible to cut the modular lighting strips of embodiments of the invention. For example, if desired, it is possible to cut a strip at the time of installation, to provide a length of strip lighting that is less than the length of the modular segment provided in whole. Likewise, the strips can be cut to provide for fewer LEDs than are installed on the entire strip. Cutting can be readily performed, such as at the time of installation of the device(s). Such adaptability and modularity is especially applicable to the flexible lighting devices and systems of the invention but these features are equally applicable to rigid lighting systems and devices as well.

The lighting strips according to embodiments of the invention can be configured so as to provide plug-type ends to the strip at the point of cutting, for example, by providing intermediate electrical contacts at one or more positions along the length of the strip which can be cut to provide two ends each having plug-type electrical contacts which can be operably connected to a socket. The lighting strips can also be cut at any point along the strip where there is no intermediate electrical contact to provide a terminal end of the circuit.

Preferred are modular lighting strips described herein which are about 1 foot in length, and/or comprise up to about 18 LEDs, such as 6, 9, or 18 LEDs, and/or are capable of being operably interconnected with one another to provide up to about 540 light sources from one electrical power supply. The lighting strips can further be interconnected and provided on reels to increase the convenience of installation. Exemplary hard or rigid lighting strips of the invention can be of any length, such as 1 foot, or 2, 3, 4, 5, or 6 feet in length and each can comprise, for example, 10 LEDs and can be interconnected with other strips, such as 4 strips, for providing a modular lighting system having up to 10 LEDs, 20 LEDs, 30 LEDs, 40 LEDs and so forth for example up to about 240 LEDs.

Also provided are connector assemblies for printed circuit boards (PCBs) comprising: a plug integrally formed at one end of a PCB; and a socket integrally formed at an opposing end of the PCB; wherein the plug and plug hole of the socket are oriented lengthwise in relation to the substrate strip and have complementary shapes to provide for removable, friction-fit, and latchless electrical interconnection of two or more substrates. Embodiments also include connector assemblies with plugs and plug holes that provide for co-planar, parallel, or perpendicular interconnection of the substrates, including any plug and plug hole orientation relative to the substrate. The connectors, whether integral with or not integral with the substrate, are typically of the male and corresponding or complementary female type, but can be of any known type of connector. It is especially preferred to have one female-type connector for one end of the lighting strip and a corresponding or complementary male-type connector for the opposing lengthwise end of the substrate.

Especially desired are lighting strip systems having such connector assemblies wherein the installed lighting system has a low profile, e.g., a lighting strip system that rises no more than about 3 mm from the surface to which it is secured.

More specifically, the connector assemblies can be configured to comprise a plug formed by electrical contacts mounted to an end of the PCB and operably connected to the PCB; and a socket mounted to an opposing end of the PCB which comprises a complementary plug hole with internal electrical contacts operably connected to the PCB.

The PCB of connector assembly embodiments of the invention can be comprised of a flexible, bendable, inflexible, hard, or rigid printed circuit board. The printed circuit board can also be supported by a heat sink to dissipate unwanted heat.

Low profile connector assembly embodiments are also included within the scope of the invention and can include such assemblies having a socket with a height or clearance of less than about 3 mm.

Further, the connector assembly can be configured to be cut, for example at the time of installation of the device, to provide an amount of product that is less than the amount presented at installation. For example, 1-foot strips of product can be cut to lengths less than 1 foot, which may or may not provide for termination of the circuit.

Modular lighting system embodiments are also included in the invention. Such lighting systems can comprise: a modular lighting system comprising: (a) a plurality of modular lighting strips each comprising: a non-conductive substrate strip comprising an electrical circuit; a plurality of light sources operably connected to the electrical circuit; a plug integrally formed at an end of the substrate strip; and a socket integrally formed at an opposing end of the substrate strip; wherein the plug and socket provide for removable, friction-fit, latchless, and electrical interconnection of two or more circuits; and (b) means for operably connecting a modular lighting strip to an electrical power supply for providing power to the light sources, e.g., light emitting diodes. The removable, friction-fit, latchless engagement is typically of the quick-release type and especially preferred are engagements which need no tools for connecting or disconnecting the components.

Means for operably connecting a modular lighting strip to an electrical power supply can be provided by the plug or socket of the lighting strip, wire leads irremovably and operably connected to the lighting strip, or a non-conductive substrate strip comprising an electrical circuit and no light sources which is capable of operably connecting to a lighting strip by way of an integrally formed plug or socket. DC jack adapters can be used, and in the case of multi-color light displays for example the red, green, blue LED lighting strips can comprise an RGB-controller for controlling the timing, duration, and changes in color of the display.

Each modular lighting strip can be configured to be any length, with 1-foot lengths being especially desired. Further, the lighting strips can comprise any number of light sources, such as 6, 9, 10, or 18 LEDs. Such strips are operably interconnectable to provide up to about 30 feet, for example, from about 15-30 feet, of strip lighting capable of being powered by one electrical power supply.

Embodiments of the invention additionally provide modular lighting systems comprising: at least one first printed circuit board (PCB), optionally comprising at least one operably mounted light emitting diode (LED), wherein the first PCB is capable of being operably connected to a power supply and to a second PCB; at least one second PCB with at least one operably mounted LED, which is capable of being operably connected to the first PCB and optionally operably connected to a third PCB; and one socket or one plug integrally formed on each PCB for operably connecting two consecutive PCBs.

The modular lighting systems can be constructed so that the first PCB is capable of being connected to a power supply by way of a plug, socket, or wire leads irremovably and operably connected to the first PCB.

Further, the modular lighting systems according to embodiments of the invention can comprise about 1-foot long PCBs with LEDs, and/or from about 6-18 LEDs, and/or are operably interconnectable to provide from about 15-30 feet of strip lighting capable of being powered by one electrical power supply.

Any of the modular lighting systems of the invention can be low profile, for example, having a height of less than about 3 mm.

BRIEF DESCRIPTION OF THE DRAWINGS

FIG. 2A shows a top plan view of a one embodiment of a multi color flex strip according to the invention.

FIG. 2B shows a rear elevation view of an exemplary embodiment of a multi color flexible lighting strip according to the invention.

FIG. 2C provides a 9-LED lighting strip embodiment.

FIG. 3A shows a rear perspective view of an exemplary socket-type end of one flex strip and a plug-type end of another flex strip unconnected.

FIG. 3B shows a rear perspective view of a socket end of one flex strip connected with the plug end of another flex strip.

FIGS. 3C-G additionally provide several views of connected and unconnected lighting strip embodiments according to the invention.

FIG. 5A shows an embodiment of a reel of flex strips.

FIG. 5B shows an embodiment of a reel of flex strips.

FIG. 11A shows a top plan view of one embodiment of a rigid lighting strip according to the invention.

FIG. 11B shows a rear elevation view of one embodiment of a rigid lighting strip according to the invention.

FIG. 12A shows a perspective view of an exemplary socket-type end of an embodiment of a rigid lighting strip according to the invention and a complementary plug-type end of another strip.

FIGS. 12C and 12D provide an example of a lighting strip with 60 LEDs.

FIGS. 13A and 13B show an embodiment of an adapter for connecting lighting strips according to the invention to a power source.

FIGS. 15A-E show various views of a waterproof lighting system according to the invention.

DETAILED DESCRIPTION OF VARIOUS EMBODIMENTS OF THE INVENTION

Reference will now be made in detail to various exemplary embodiments of the invention. The following detailed description is presented for the purpose of describing certain embodiments in detail and is, thus, not to be considered as limiting the invention to the embodiments described. Rather, the true scope of the invention is defined by the claims. Additionally, any features of any embodiment described herein are equally applicable to any other embodiment described herein or envisioned by one of ordinary skill in the art. Thus, the detailed descriptions provided herein should not be construed to exclude features otherwise described with respect to another embodiment.

Figure 1A:
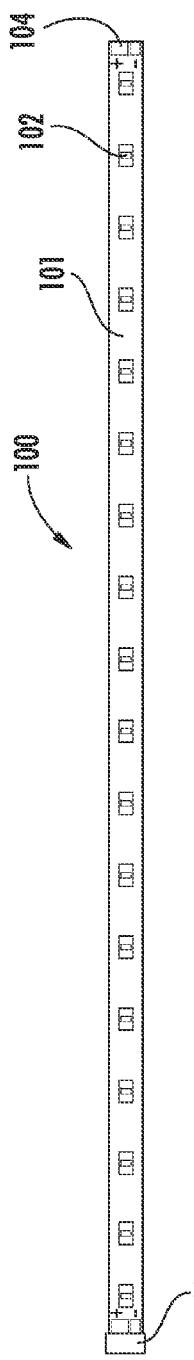
FIG. 1A shows a top plan view of one embodiment of a single color flexible lighting strip according to the invention.

FIG. 1A shows a top plan view of one embodiment of a single color flexible lighting strip (flex strip) 100 according to the invention. The flex strip 100 comprises a non-conductive substrate strip 101 comprising an electrical circuit (not shown); a plurality of light sources 102 operably connected to the electrical circuit; a socket 103 integrally formed at one end of the substrate strip 101; a plug 104 integrally formed at an opposing end of the substrate strip 101; and wherein the plug 104 and socket 103 provide for removable, friction-fit, latchless, and electrical interconnection of two or more circuits. Flex strips 100 are also considered connector assemblies having LED light sources 102, but connector assemblies can comprise other electrical components or simply provide for connection of multiple printed circuit boards.

As shown in FIG. 1A, the flexible lighting strip 100, whether a single- or multi-color light strip, can comprise a substrate 101 for supporting an electrical circuit (not shown) and a predetermined number of light sources 102. As shown, substrate 101 comprises a flexible material. What is meant by flexible in the context of this application is that the lighting strip can conform to any surface shape to which it is intended to be installed upon. In preferred embodiments, a flexible lighting strip when held in the hand can be manipulated with very little force from the fingers or simply from gravity. If desired, however, substrate 101 of this example could alternatively comprise a rigid material, e.g., a material intended to be installed on a flat surface or otherwise not easily bendable or which requires substantial force to manipulate.

The substrate (e.g., printed circuit board or PCB) for the flexible lighting devices 100 and systems according to the invention can comprise any electrically non-conductive material, such as plastic. The exact materials for the substrate are not critical and options within the skill in the art are available, so long as the substrate provides sufficient support for the components mounted to it (such as LEDs, ICs, and resistors) and the overall lighting devices 100 are flexible and allow for the lighting strip devices 100 to conform to various surface shapes. Such substrates 101 are also referred to as flexible printed circuits or FPCs. The electrically conductive pathway (not shown) can comprise any electrically conductive material such as aluminum or copper. The conductive pathway can be affixed to the PCB 101 by any known means available in the art, including being sandwiched between two layers of electrically non-conductive substrate, so as to provide protection from external elements, such as moisture. Embodiments of the invention include waterproof and non-waterproof lighting strips 100.

Any light source 102 can be used but which is usually dictated by a specific application. Appropriate light sources 102 can include high brightness PLCC-2 SMD LEDs. Such LEDs have a 120 degree viewing angle for even light and are available in various colors, including without limitation white (neutral, cool, and warm), red, yellow, blue, and green. The lighting strips 100 can be constructed to comprise single-color or multi-color light source 102 configurations. For example, the lighting strips 100 can comprise single-color red, yellow, green, blue, cool white, neutral white, or warm white or multi-color (RGB-color) red, green, and blue colored LEDs 102. Several color combinations are possible and within the skill of the art. In FIG. 1A, the light sources 102 are light emitting diodes (LEDs).

At one end of the light strip shown in FIG. 1A, there is a socket-type connector 103. The socket-type connector 103 provides for physical connection of two lighting strips 100 and electrical connection of the electrical circuits (not shown) of the strips 100. The socket-type connector 103 can be of any known connector as long as it is capable of providing both physical and electrical connection of the components. The lighting strips 100 also comprise at the opposing lengthwise end of the strip 100 a plug-type connector 104. The plug 104 and socket 103 connectors are complementary configured to provide for mating of the plug 104 of one light strip 100 with the socket-type end 103 of another strip 100. The plug 104 and socket 103 are preferably integrally formed with the substrate 101, for example, by soldering or otherwise adhering the electrically-conductive components of the plug 104 and socket 103 to the electrical circuit of the PCB 101. The plug 104 and socket 103 are operably connected to the electrical circuit of the PCB when their electrical components (wire leads and electrical contacts) are capable of providing for continuity in an electrical path from the circuit of one PCB to the circuit of another PCB during use of the lighting strips.

In embodiments, the substrate strip 101 is flexible; the light sources 102 are light emitting diodes (LEDs); the plug 104 is formed by electrical contacts mounted to an end of the substrate strip and operably connected to the electrical circuit; and the socket 104 is mounted to an opposing end of the substrate strip 101 and comprises a plug hole (not shown) with internal electrical contacts operably connected to the electrical circuit; wherein the plug 104 and plug hole are oriented lengthwise in relation to the substrate strip 101 and have complementary shapes to provide for interconnection of two or more substrates 101 and their circuits.

The lighting strips 100 can be manufactured in 6-inch, 1-foot, or 18-inch lengths, or any length increment, each length comprising any number of LEDs 102. Further, especially with respect to the longer lengths, the substrate 101 can comprise a material that provides for cutting of the flex strips 100, typically at the time of installation, to a shorter length. In one embodiment, lighting strips 100 can be provided in one length with 18 LEDs 102, which is capable of being cut to a shorter length, for example, of 9 LEDs 102, if desired. In particular embodiments of the invention, the single-color lighting strips 100 can be configured to be subsequently cut (typically at installation) into strips 100 comprising 9 LEDs 102, for example for red and yellow colors, and into strips 100 comprising 6 LEDs 102 for example for blue, green, and white colors. The flexible substrate 101 material further facilitate surface mounting of the lighting strips 100. For example, the flexible material enables affixation to a variety of surface shapes, outlines, and contours, including angular, linear, and curved surface shapes.

Figure 1B:
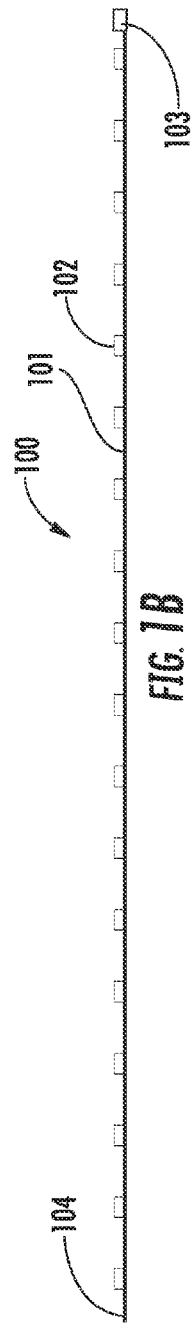
FIG. 1B shows a rear elevation view of a single color flexible lighting strip according to the invention.

FIG. 1B shows a rear elevation view of the single color flexible lighting strip 100 shown in FIG. 1A. Emphasized in this view is the low-profile capability of the lighting strips 100. For example, the lighting strip 100, the light sources 102, and/or the socket 103 can be about 3 mm in height or less from the substrate 101. In one embodiment, the lighting strips 100 with the light sources 102 and socket 103 installed can have a height profile of about 3 mm. The light sources 102 can be the same height, shorter, or taller than the socket 103, depending on a particular application. The LED light sources 102 (2.5 mm) in FIG. 1B are slightly shorter than the socket 103 (3 mm). Further, in one embodiment, for example, the length of the lighting strips 100 can be approximately 300 mm, from the end of the female connector 103 to the end of the male connector 104, and the width approximately 9 mm, which includes the overall dimensions of the female connector 103. Likewise, the height of the LEDs 102 can also be low profile, meaning a height of about 2.5 mm or less, such as about 1.8 mm, or any dimension below approximately 3 mm.

Figure 1C:
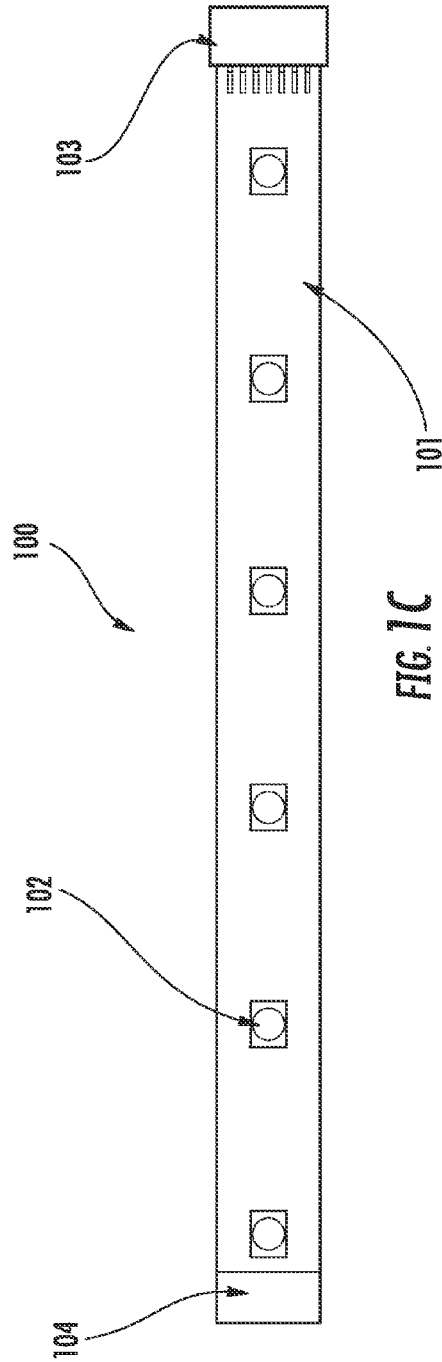
FIG. 1C provides a 6-LED lighting strip embodiment.

FIG. 1C shows a 6-LED lighting strip 100 according to the invention. In this embodiment a flexible PCB 101 supports 6 LEDs 102 and has a female socket connector 103 at one end of PCB 101 and a male plug connector 104 at the opposing end of PCB 101.

FIG. 2A shows a top plan view of one embodiment of a multi color flex strip 200 according to the invention. The flex strip 200 can comprise a substrate 201, flexible or inflexible as with the single color flex strips but preferably flexible. In particular common substrates include printed circuit boards (PCBs) made of flexible plastic. The flex strips 200 can comprise light sources 202, such as one or more colors of LEDs 202, for example, red, green, and blue LEDs 202, which is commonly referred to as a RGB flex strip 200. A socket end 203 lies at one end of the substrate 201 and a plug end 204 lies at the other end of the substrate 201, where both the socket 203 and plug 204 are electrically and physically connected to the substrate 201. A typical type of connection of the plug 204 and socket 203 to the electrical circuit of the substrate 201 is by soldering metal leads from each of the socket 203 and plug 204 to the electrical circuit. Other types of connections may also be appropriate, including connections that can be engaged or disengaged at any time, e.g., a releasable connection.

Additionally, the lighting strips of all embodiments of the invention can be configured to be cut at predetermined intervals to provide the desired number of light sources 202 or the desired length of lighting materials for a particular application. Exemplary positions where the strips 200 may be cut are provided at cut indicators 205. Cut indicators can be perforated sections of substrate 201 or markings on the substrate to indicate where a cut may be made. Further for example, in particular embodiments, the lighting strips 200 can be configured with cut indicators 205 that provide for the substrate strip 201 to be cut into strips comprising 6 LEDs 202. The lighting strips 200 according to embodiments of the invention can be configured to provide plug-type 204 contacts to the strip 201 as a cutting point 205. In particular, for example, intermediate electrical contacts at one or more positions along the length of the substrate 201 can be provided for allowing for two ends each having plug-type 204 contacts when the substrate 201 is cut. Plug ends 204 can then be operably connected to a socket 203. The lighting strips 200 can also be cut at any point along the substrate 201 where there is no intermediate electrical contact to provide a terminal end of the circuit.

Any of the lighting strips 200 of embodiments of the invention can further comprise an adhesive (not shown) for mounting the lighting strips 200 to a surface. For example, the adhesive can be applied to the bottom surface of the lighting strips 200 and temporarily protected with tape which can be removed at the time of installation to expose the adhesive.

FIG. 2B shows a rear elevation view of an exemplary embodiment of a multi color flexible lighting strip 200 according to the invention. The lighting strips 200 can comprise a predetermined number of LEDs 202 mounted to substrate 201 along its length at any interval between socket 203 and plug 204. As shown in FIG. 2B, the flex strips 200 can comprise 9 LEDs 202, spaced equally or at different intervals from one another along the length of the substrate 201. Other flex strips 200 can comprise any number of LEDs 202, such as 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 or more, with 6, 9, or 18 preferred. Indeed, any number of LEDs 202 can be used for each flex strip 200.

FIG. 2C shows a 9-LED flex strip 200 embodiment with a substrate 201 and mounted thereon or thereto are 9 LEDs 202. Socket end 203 is mounted to one end of the PCB 201, while plug end 204 is mounted to the other end.

FIGS. 3A-G provide various views of the inventive lighting strip embodiments. In particular, FIG. 3A shows a rear perspective view of an exemplary socket-type 303 end of one flex strip 300 and a plug-type 304 end of another flex strip 300 unconnected, while FIG. 3B shows the components connected. FIG. 3C provides a top plan view of two unconnected 9-LED 302 lighting strips 300 according to embodiments of the invention, while FIG. 3D provides an elevation view of the strips 300. FIG. 3E provides an example of a lighting strip 300 according to the invention comprising 18 LEDs 302. FIG. 3F shows a top plan view of three consecutively assembled lighting strips 300 according to the invention. FIG. 3G provides a top perspective view of two lighting strips 300 unconnected.

Embodiments of the invention include plugs 304 and plug holes 306 that provide for co-planar, parallel, or perpendicular interconnection of the substrates 301, including any plug 304 and plug hole 306 orientation relative to the substrate 301. The embodiments of FIGS. 3A and 3B, which show a plug hole 306 in a plane that lies parallel to the plane of the substrate 301 to which the socket 303 is attached, provide for interconnection of substrates 301 in a manner that allows for one substrate 301 to be in one plane and a subsequent interconnected substrate 301 to be in another parallel plane (if the strips 100 are inflexible or pulled tight). Of course, with flexible substrates 301, the substrates 301 can be positioned substantially in the same plane when installed on a surface. Other examples of substrate 301 orientation include where the substrates 301 are interconnected in a manner that provides for a perpendicular arrangement. One way to achieve this is to have plug hole 306 facing upward (in the same direction as the upper surface of the substrate 301) so that when a subsequent substrate 301 is connected to the first substrate 301, they can lie in planes that are perpendicular to one another. Such a configuration would make it easier to apply the lighting strips 300 to a surface that has a 90° corner.

The connectors 303, 304 are preferably "integral" to or "integrally" formed with the lighting strips 300. This means that any connection to the substrate 301 of connectors 303, 304 that provides for the connectors 303, 304 to be incorporated, part of, attached to, or not readily removable from the substrate 301, e.g., the printed circuit board (PCB) 301 would be appropriate. For example, the female connector 303 can be integrally formed with the PCB 301 by soldering the electrical contacts 307 to the electrically conductive pathway 308 printed on the circuit board 301. Further, the female connector 303 can be capable of being integrally formed with the PCB 301 by providing a housing structure for the female connector 303 that is capable of being readily soldered to the PCB 301. Likewise, the male connector 304 can simply comprise electrical contacts 307 mounted directly to the PCB 301 and in communication with the electrically conductive pathway 308 mounted to or incorporated into the substrate or PCB 301. In other embodiments, the male 303 and female 304 connectors can be configured to be connectable with the flexible lighting strips 300 instead of integrally formed as part of the lighting strip provided as a single unit.

The lighting strips 300 can be cut to a desired length at indicators 305.

Figure 4:
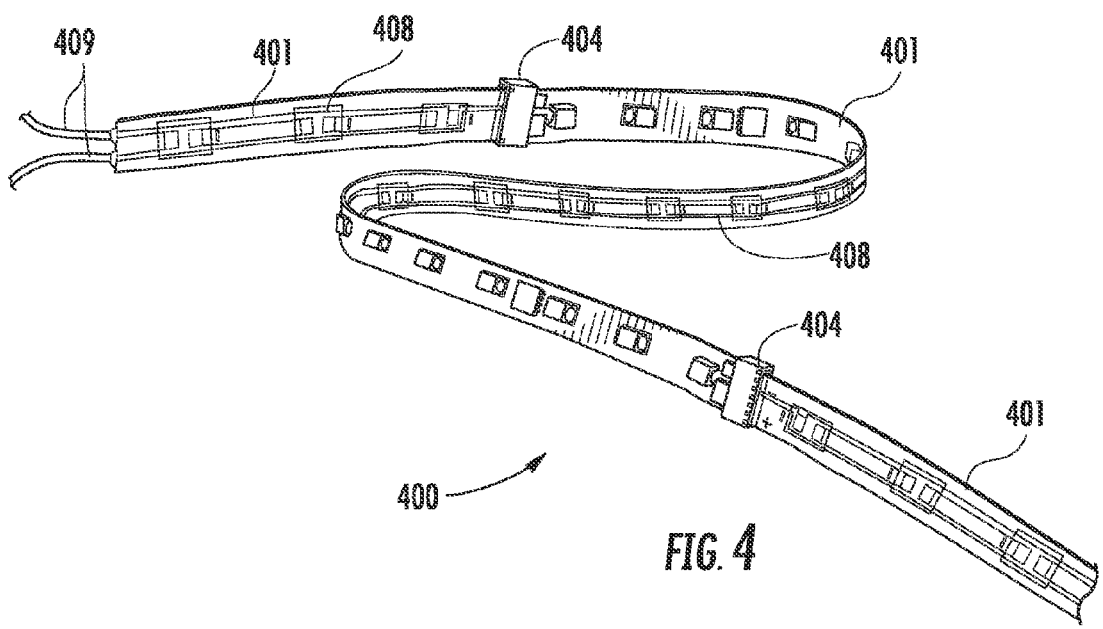
FIG. 4 shows an embodiment of a flex strip lighting system.

FIG. 4 shows an embodiment of a flex strip lighting system 400. As shown, multiple substrates 401 may be interconnected to provide a system 400. Any number of substrate strips 401 can be interconnected to form any length system 400. Components of the systems 400 can further comprise means for connecting the substrates 401 to a power source (not shown) for providing power to the LEDs 402 by way of the electrically conductive pathways 408 incorporated into or onto the PCBs 401. As shown in FIG. 4, the connection to the power source can be made by way of wire leads 409 that can be permanently secured to a PCB 401 (with or without LEDs 402) and the power source. Likewise, the connection can be made by having a power source with a complementary mating receptacle to accept either the socket 403 or plug-type 404 end of the lighting strip system 400.

Also shown in FIG. 4, a plurality (more than one) of substrate strips 401 can be connected by way of the integrally formed male 404 and female 403 connectors of the invention. For example, at one end of the substrate 401 can be a female connector 403 for communication and engagement with a male connector 404 of another substrate strip 401. Multiple strips 401 can be connected end to end by way of the male 404 and female 403 connectors to comprise a modular and flexible lighting system 400. Any number of lighting strips 401 can be interconnected. In one embodiment, for example, up to a total of 30 ft. of interconnected lighting strips 401 can be used for single-color flexible lighting strips 401 to provide, e.g., up to 540 LEDs 402. In another embodiment, for example, up to a total of 15 ft. of interconnected lighting strips 401 can be used for RGB-color flexible lighting strips 401, which will provide up to 270 LEDs 402.

FIGS. 5A and 5B show an embodiment of a reel of flex strips 520. More particularly, a reel 511 can be provided with a series of interconnected flexible lighting strips 500 wound around the reel. The strips 500 can be provided assembled (shown) or unassembled (not shown), with the assembled strips 500 being more convenient for the end user to install. FIG. 5A shows the interconnected strips 500 wound tight around reel 511 for convenient packaging and FIG. 5B shows the strips 500 on the reel 511 but with several loops of the strips 500 loosely wound around reel 511.

Figure 6A:
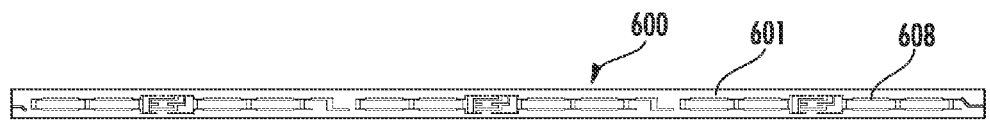
FIG. 6A shows an exemplary PCB of a single color flex strip.
Figure 6B:
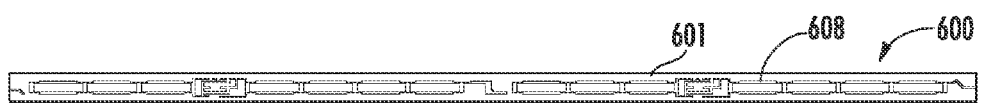
FIG. 6B shows an exemplary PCB of a single color flex strip.
Figure 6C:
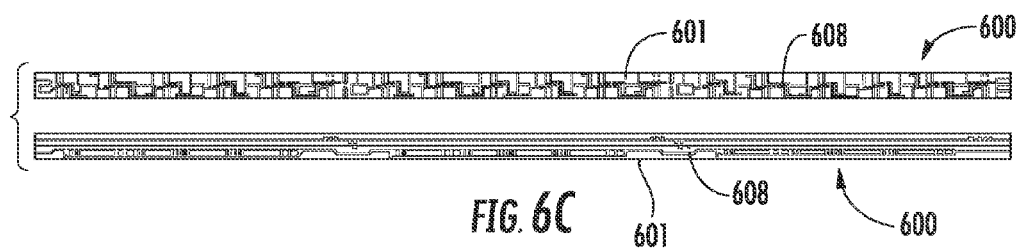
FIG. 6C shows exemplary PCBs of a multi color flex strip.

FIGS. 6A-C show exemplary embodiments of PCBs of single- and multi-color flex strips 600 according to the invention. The PCB substrate 601 can be made of any material appropriate for a particular application, but is preferably flexible plastic. In particular the plastic is preferably of an appropriate flexibility and/or thickness to provide sufficient support for the electrical circuit 608 and LEDs (not shown). The circuit 608 printed on the PCB 601 is preferably copper and provides for movement of electricity through the device 600 to another strip lighting device 600 during use. If desired, the PCB 601 and electrical pathway 608 can be moisture protected or not, e.g., by encapsulation of the components with a waterproof material.

Figure 7A:
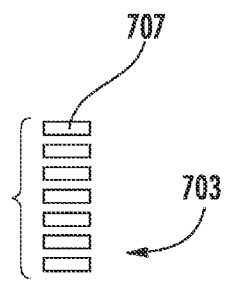
FIG. 7A shows a top plan view of electrical contacts for connecting a socket to the electrical circuit of a single color PCB lighting strip.
Figure 7B:
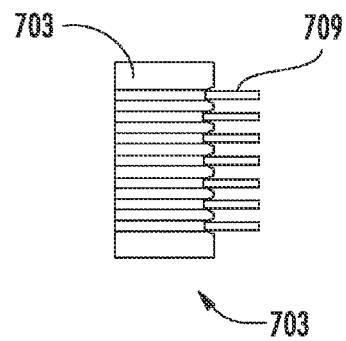
FIG. 7B shows a bottom plan view of an exemplary socket for an embodiment of a single color lighting strip according to the invention.
Figure 7C:
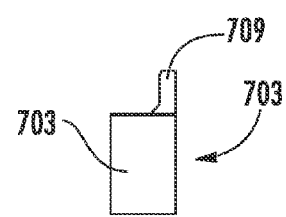
FIG. 7C shows a side elevation view of an exemplary socket for an embodiment of a single color lighting strip according to the invention.
Figure 7D:
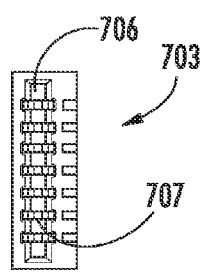
FIG. 7D shows a front elevation view of socket with plug hole for an embodiment of a single color lighting strip according to the invention.
Figure 7E:
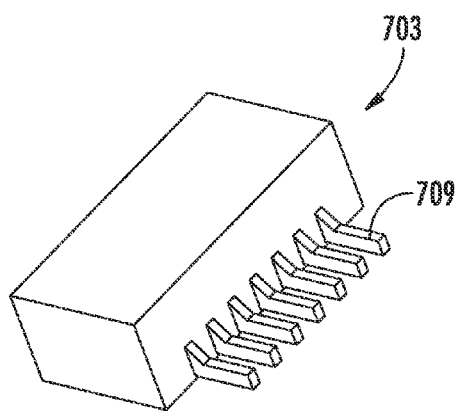
FIGS. 7E-F show perspective views of a socket with plug hole for an embodiment of a single color lighting strip according to the invention.
Figure 7F:
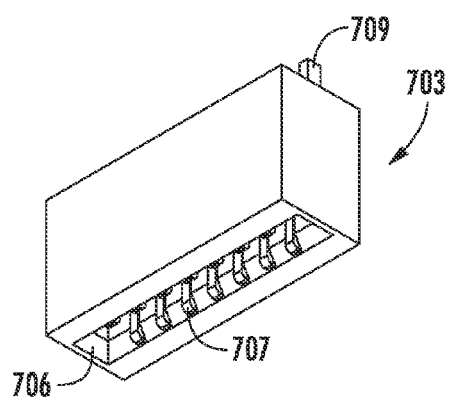

FIGS. 7A-F and 8A-B show various views of an exemplary socket-type end 703 and complementary plug-type 804 end of a single color flex strip. In particular, FIG. 7A shows a top plan view of a representative formation of electrical contacts 707 that could be installed in or on a substrate at the socket end 703. As shown, multiple contacts 707 are provided, e.g., 7. Each electrical contact 707 corresponds in size, shape, length, and number with a wire lead 709 incorporated as part of socket 703. A bottom plan view of socket 703, FIG. 7B, shows wire leads 709 extending externally from socket 703. Further, FIG. 7C shows another view of the socket 703, a side elevation view, highlighting the wire leads 709, which are preferably irremovably connected to the contacts 707. Both the wire leads 709 and contacts 707 are spaced and sized to accommodate connection with one another and provide for an electrical path from the circuit of one PCB to the circuit of another during use. In FIG. 7D, a front elevation view of socket 703 is provided, which provides a more detailed view of plug hole 706. The plug hole 706 comprises electrical contacts 707 within the hole 706, which correspond to the number of contacts 707 and wire leads 709. As further shown in FIG. 7E, a perspective view of the rear of the socket 703, electrical contacts 709 operably connected to socket 703 extend from the socket and can be made integral with one end of a lighting strip, for example, by soldering contacts 709 to the electrical circuit of a PCB lighting strip. FIG. 7F provides another perspective view of socket 703, a front and top view, which highlights one embodiment for electrical contacts 707 on the interior recess 706 of socket 703, as well as electrical contacts 709 which are operably connected therewith.

Figure 8A:
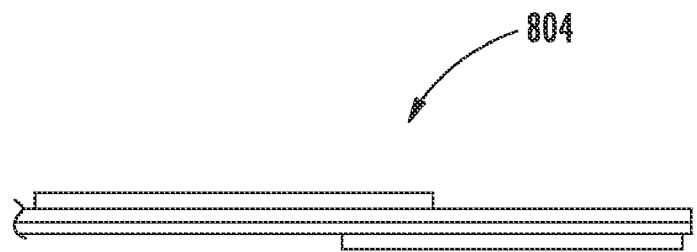
FIG. 8A shows a side elevation view of a plug integral to the PCB of an embodiment of a single color lighting strip according to the invention.
Figure 8B:
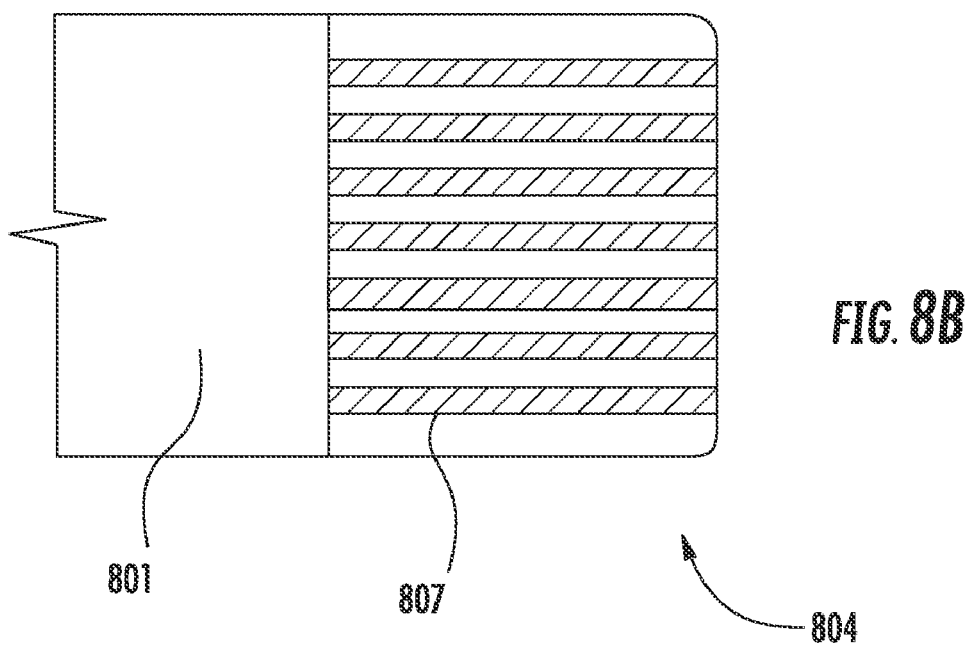
FIG. 8B shows a top plan view of a plug with electrical contacts integrally mounted to a substrate of a single color lighting strip according to the invention.

FIGS. 8A-B show, respectively, a side elevation view and a top plan view of an exemplary plug-type 804 end of a single color flex strip 801. In this embodiment, the plug 804 comprises electrical contacts 807. Electrical contacts 807 can be arranged in or on the substrate 801 in any manner. As shown in this embodiment, 7 electrical contacts 807 are arranged lengthwise to substrate 801 and parallel to one another with some spacing between them. The contacts 807 can be connected, preferably irremovably mounted, to the substrate 801 in a manner that provides for physical and electrical connection of the contacts 807 to the electrical circuit (not shown) of the substrate 801. As shown in FIG. 8A, the plug 804 can overlap with the substrate 801 slightly to provide for the connection by way of contacting the contacts 807 with appropriate parts of the PCB circuit. The material of the plug 804 is advantageously also plastic, however, typically a more rigid material than substrate 801. As shown, several layers of the same or different material may be used to increase the strength of the strip at plug 804. Having a more rigid plug 804 will provide for ease of connection with a corresponding socket during use, as guiding and inserting the plug 804 into the socket will be easier with a more rigid material. The plug 804 has a size and shape that complement the size and shape of a corresponding socket. The complementary size and shape allow for a friction fit, releasable, and latchless engagement between a socket and plug, for example, the socket 703 and plug 804 of FIGS. 7A-8B.

Figure 9A:
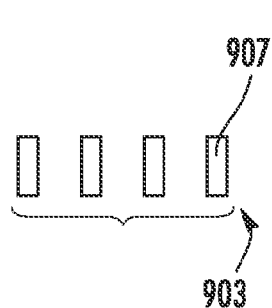
FIG. 9A shows a top plan view of electrical contacts for connecting a socket to a substrate strip of a multi-color lighting strip according to the invention.
Figure 9B:
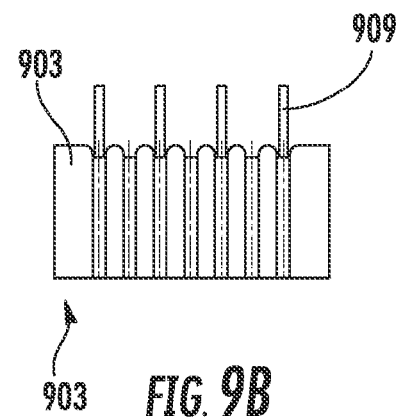
FIG. 9B shows a bottom plan view of an exemplary socket for a multi-color lighting strip according to the invention.
Figure 9C:
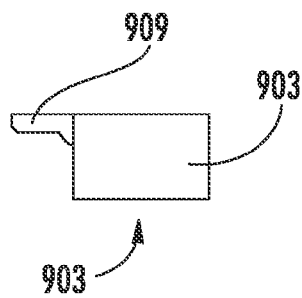
FIG. 9C shows a side elevation view of an exemplary socket for a multi-color lighting strip according to the invention.
Figure 9D:
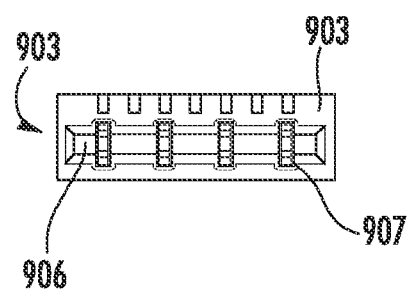
FIG. 9D shows a front elevation view of an exemplary socket comprising a plug hole for a multi-color lighting strip according to the invention.

FIGS. 9A-D and 10A-B show various views of an exemplary socket-type end 903 and complementary plug-type 1004 end of a multi-color flex strip. In particular, FIG. 9A shows a top plan view of a representative formation of electrical contacts 907 that could be installed in or on a substrate at the socket end 903. As shown, multiple contacts 907 are provided, e.g., 4. Each electrical contact 907 corresponds in size, shape, length, and number with a wire lead 909 incorporated as part of socket 903. A bottom plan view of socket 903, FIG. 9B, shows wire leads 909 extending externally from socket 903. Further, FIG. 9C shows another view of the socket 903, a side elevation view, highlighting the wire leads 909, which are preferably irremovably connected to the contacts 907. Both the wire leads 909 and contacts 907 are spaced and sized to accommodate connection with one another and provide for an electrical path from the circuit of one PCB to the circuit of another during use. In FIG. 9D, a front elevation view of socket 903 is provided, which provides a more detailed view of plug hole 906. The plug hole 906 comprises electrical contacts 907 within the hole 906, which correspond to the number of contacts 907 and wire leads 909.

Figure 10A:
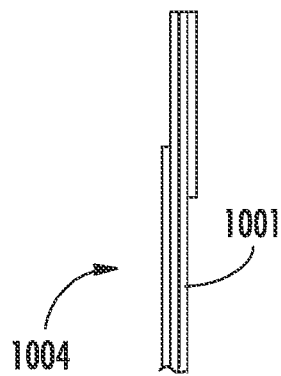
FIG. 10A shows a side elevation view of a plug integral to a substrate strip of an exemplary multi-color lighting strip according to the invention.
Figure 10B:
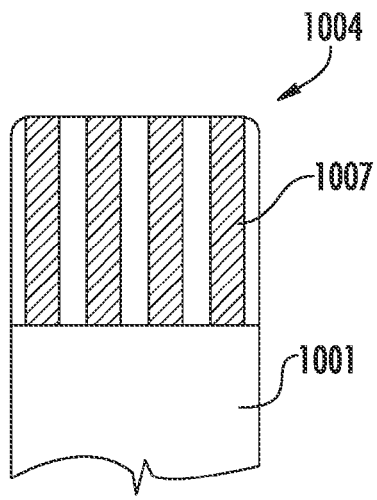
FIG. 10B shows a top plan view of a plug having electrical contacts mounted on a substrate strip for a multi-color lighting strip of the invention.

FIGS. 10A-B show, respectively, a side elevation view and a top plan view of an exemplary plug-type 1004 end of a multi-color flex strip 1001. In this embodiment, the plug 1004 comprises electrical contacts 1007. Electrical contacts 1007 can be arranged in or on the substrate 1001 in any manner. As shown in this embodiment, 4 electrical contacts 1007 are arranged lengthwise to substrate 1001 and parallel to one another with some spacing between them. The contacts 1007 can be connected, preferably irremovably mounted, to the substrate 1001 in a manner that provides for physical and electrical connection of the contacts 1007 to the electrical circuit (not shown) of the substrate 1001. As shown in FIG. 10A, the plug 1004 can overlap with the substrate 1001 slightly to provide for the connection by way of contacting the contacts 1007 with appropriate parts of the PCB circuit. The material of the plug 1004 is advantageously also plastic, typically a more rigid material than substrate 1001 or several layers of the same material. A more rigid plug 1004 will provide for ease of connection with a corresponding socket during use, as guiding and inserting the plug end 1004 into the socket will be easier with a more rigid material. The plug 1004 has a size and shape that complement the size and shape of a corresponding socket. The complementary size and shape allow for a friction fit, releasable, and latchless engagement between a socket and plug, for example, the socket 903 and plug 1004 of FIGS. 9A-10B.

FIG. 11A shows a top plan view of one embodiment of a single color rigid lighting strip 1100 according to the invention. The lighting strip 1100 comprises a non-conductive substrate strip 1101 comprising an electrical circuit (not shown); a plurality of light sources 1102 operably connected to the electrical circuit; a socket 1103 integrally formed at one end of the substrate strip 1101; a plug 1104 integrally formed at an opposing end of the substrate strip 1101; and wherein the plug 1104 and socket 1103 provide for removable, friction-fit, latchless, and electrical interconnection of two or more circuits. The plug 1104 and socket 1103 can be mounted to the substrate 1101 by any means including by soldering directly to electrical contacts on the substrate or by adhering the plug 1104 or socket 1103 to the substrate mechanically with screws, rivets, or with glue to name a few examples, while ensuring acceptable contact between the plug 1104 and circuit of the strip and socket 1103 and the circuit of the strip. The substrate strips 1100 are also considered connector assemblies having LED light sources 1102, but connector assemblies can comprise other electrical components or simply provide for connection of multiple printed circuit boards.

As shown in FIG. 11A, the lighting strip 1100, whether a single- or multi-color light strip, can comprise a substrate 1101 for supporting an electrical circuit (not shown) and a predetermined number of light sources 1102. Substrate 1101 in this example comprises a rigid material. The material for substrate 1101, however, could be substituted with a flexible material while retaining other components, e.g., the connectors, shown in this embodiment. Indeed, any of the components in any of the embodiments provided in this application could be substituted one for another using ordinary skill in the art to render a lighting strip suitable for a particular application.

The substrate (e.g., printed circuit board or PCB) for the rigid lighting devices 1100 and systems according to the invention can comprise any electrically non-conductive material, such as plastic. The exact materials for the substrate are not critical and options within the skill in the art are available. The amount of rigidity of the substrate 1101 in the context of the rigid lighting strips is not critical, especially in situations where the substrate is supported by another member, such as a trough-shaped heat sink. In situations where a housing or heat sink for the lighting strip is not desired, then more rigidity in the substrate 1101 material may be desired, e.g., it may be desired to have sufficient rigidity for the lighting strip to be capable of retaining its shape without being supported by another member. The electrically conductive pathway (not shown) can comprise any electrically conductive material such as aluminum or copper. The conductive pathway can be affixed to the PCB 1101 by any known means available in the art, including being sandwiched between two layers of electrically non-conductive substrate, so as to provide protection from external elements, such as moisture. Embodiments of the invention include waterproof or non-waterproof lighting strips 1100.

Any light source 1102 can be used but which is usually dictated by a specific application. Appropriate light sources 1102 can include high brightness 0.5 W SMD LEDs or 0.5 W SMD PLCC-2 LEDs or 0.5 W SMD PLCC-6 LEDs. Such LEDs have a 120 degree viewing angle for even light and are available in various colors, including without limitation white (neutral, cool, and warm), red, yellow, blue, and green. The lighting strips 100 can be constructed to comprise single-color or multi-color light source 1102 configurations. For example, the lighting strips 1100 can comprise single-color red, yellow, green, blue, cool white, neutral white, or warm white or multi-color (RGB-color) red, green, and blue colored LEDs 1102. Several color combinations are possible and within the skill of the art. In FIG. 11A, the light sources 1102 are light emitting diodes (LEDs). Any number of LEDs 1102 can be mounted to any length of lighting strip 1101. Some embodiments include 1-, 2-, or 3-foot strips having for example 18, 36, or 54 LEDs. Any number of lighting strips 1101 can be interconnected and operated by one power source.

At one end of the light strip shown in FIG. 11A, there is a female or socket-type connector 1103. The socket-type connector 1103 provides for physical connection of two lighting strips 1100 and electrical connection of the electrical circuits (not shown) of the strips 1100. The socket-type connector 1103 can be of any known connector as long as it is capable of providing both physical and electrical connection of the components. The lighting strips 1100 also comprise at the opposing lengthwise end of the strip 1100 a plug-type connector 1104. The plug 1104 and socket 1103 connectors are complementary configured to provide for mating of the plug 1104 of one light strip 1100 with the socket-type end 1103 of another strip 1100. The plug 1104 and socket 1103 are preferably integrally formed with the substrate 1101, for example, by soldering or otherwise adhering or contacting the electrically-conductive components of the plug 1104 and socket 1103 to the electrical circuit of the PCB 1101. The plug 1104 and socket 1103 are operably connected to the electrical circuit of the PCB when their electrical components (wire leads and electrical contacts) are capable of providing for continuity in an electrical path from the circuit of one PCB to the circuit of another PCB during use of the lighting strips. This embodiment provides an example of a latchless-type engagement of the plug 1104 and socket 1103, but embodiments with latch-type engagements, especially those having quick disconnect capabilities, are also within the scope of this invention.

In embodiments, the substrate strip 1101 is rigid; the light sources 1102 are light emitting diodes (LEDs); the plug 1104 is formed by electrical contacts mounted to an end of the substrate strip and operably connected to the electrical circuit; and the socket 1104 is mounted to an opposing end of the substrate strip 1101 and comprises a plug hole (not shown) with internal electrical contacts operably connected to the electrical circuit; wherein the plug 1104 and plug hole are oriented lengthwise in relation to the substrate strip 1101 and have complementary shapes to provide for interconnection of two or more substrates 1101 and their circuits.

FIG. 11B shows a rear elevation view of the lighting strip 1100 shown in FIG. 11A. Emphasized in this view is the low-profile aspect of the lighting strips 1100. For example, the lighting strip 1100, the light sources 1102, and/or the socket 1103 can be about 3 mm in height or less from the substrate 1101. In one embodiment, the lighting strips 1100 with the light sources 1102 and socket 1103 installed can have a height profile of about 3 mm, where for example the substrate 1101 is about 1 mm and the LEDs 1102 are about 2 mm in height. The light sources 1102 can be the same height, shorter, or taller than the socket 1103, depending on a particular application. The LED light sources 1102 in FIG. 11B are slightly shorter than the socket 1103. Further, in one embodiment, for example, the length of the lighting strips 1100 can be approximately 300 mm, from the end of the female connector 1103 to the end of the male connector 1104, and the width approximately 11-12 mm, which includes the overall dimensions of the female connector 1103. Likewise, the LEDs 1102 can also be low profile, meaning a height of about 2.5 mm or less, such as about 2 mm or 1.8 mm, or any dimension below approximately 3 mm.

Figure 12B:
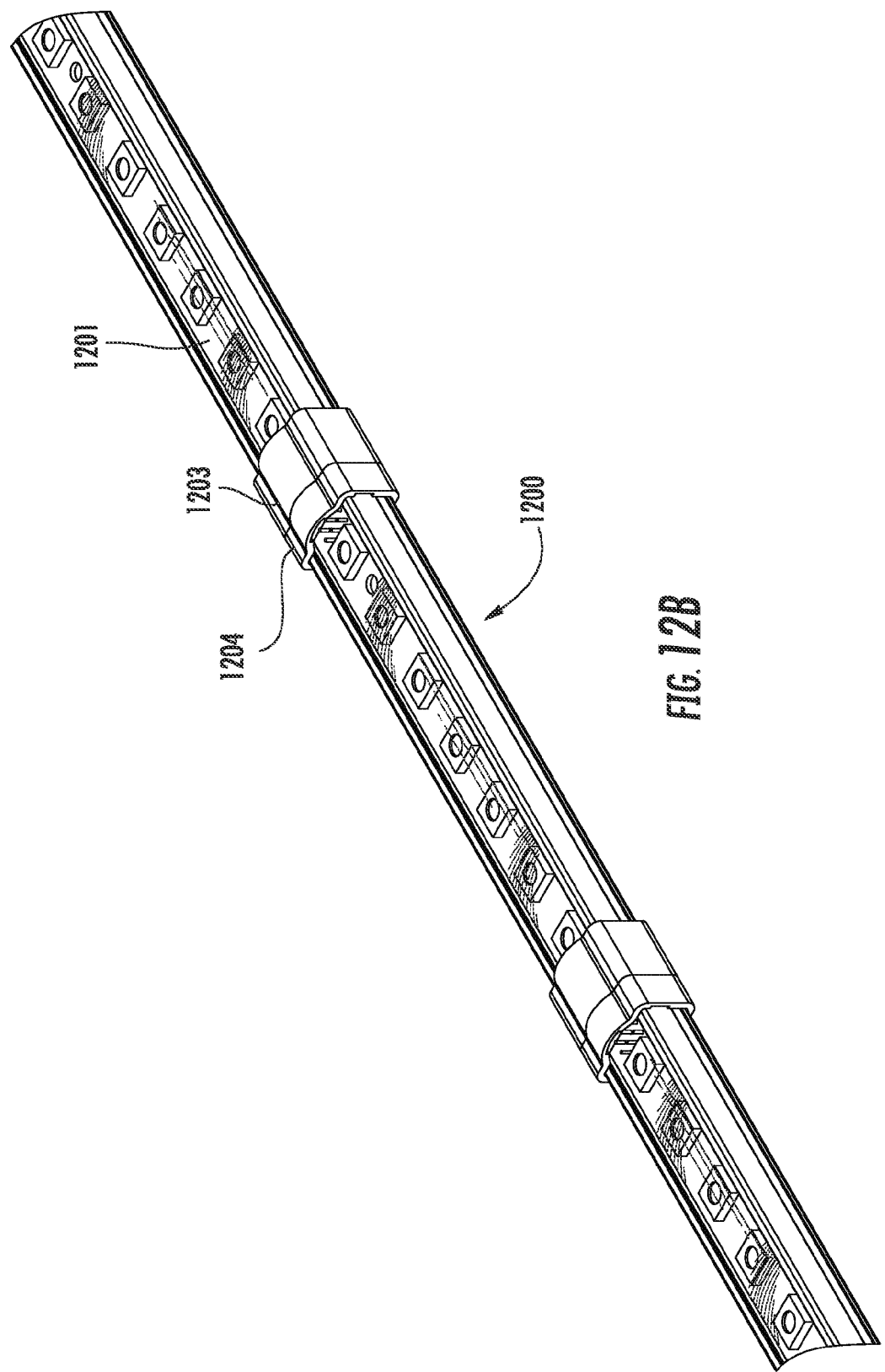
FIG. 12B shows a rigid lighting system according to the invention where three lighting strips are operably interconnected.
Figures 14E, 14F:
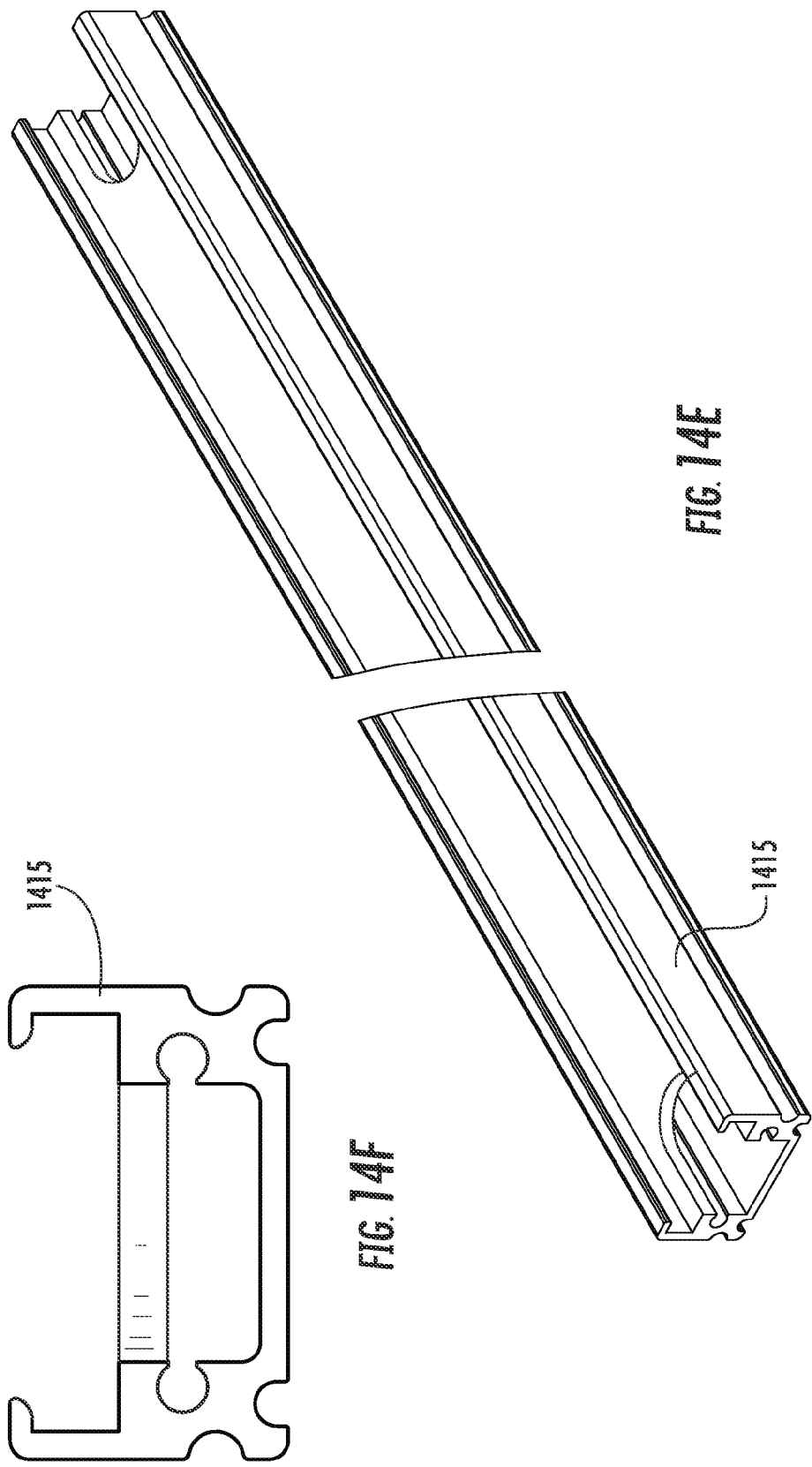
FIGS. 14A-I show various views of components of an embodiment of rigid lighting systems according to the invention.
Figure 14T:
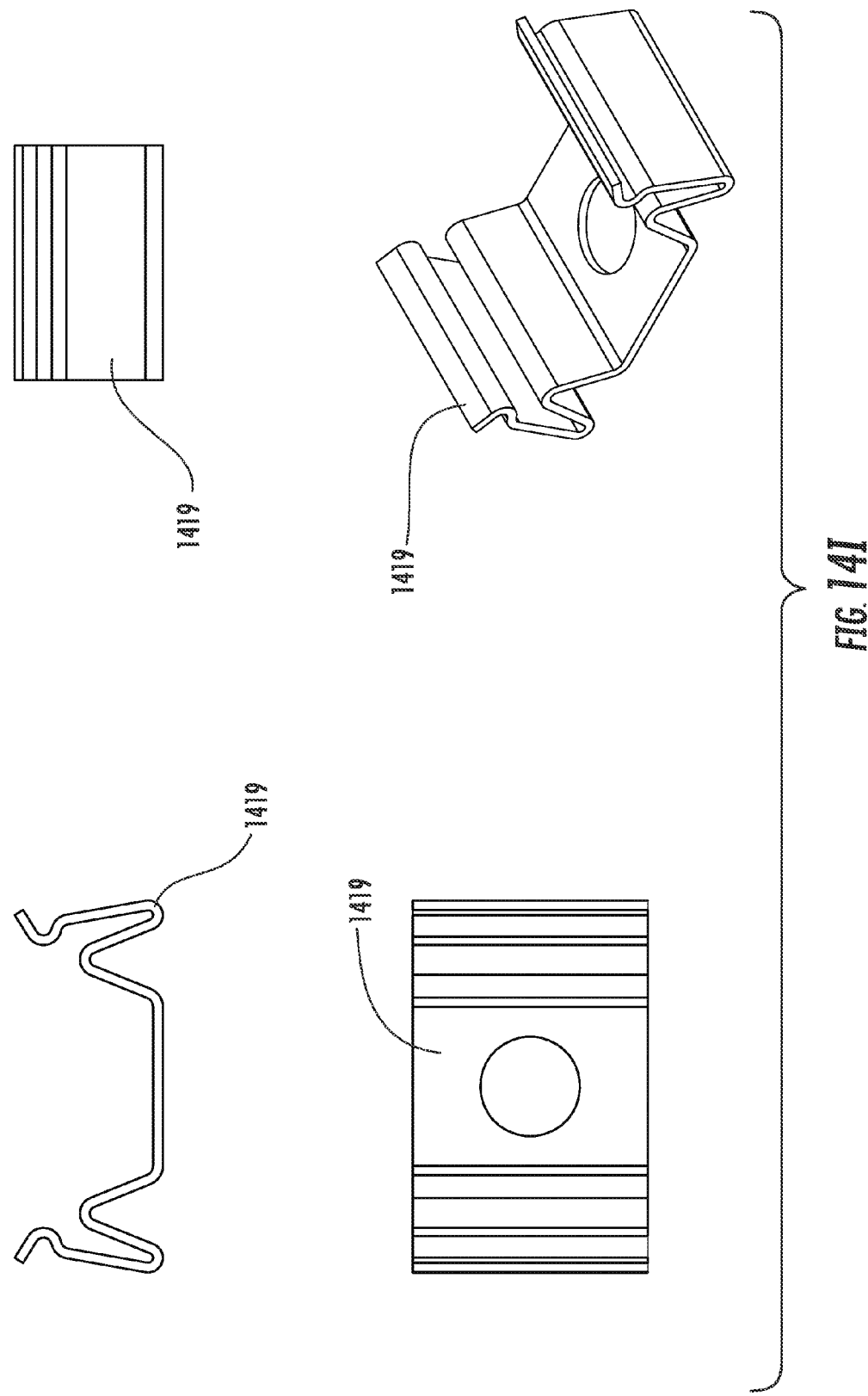
Figures 16A, 16B, 16C, 16D:
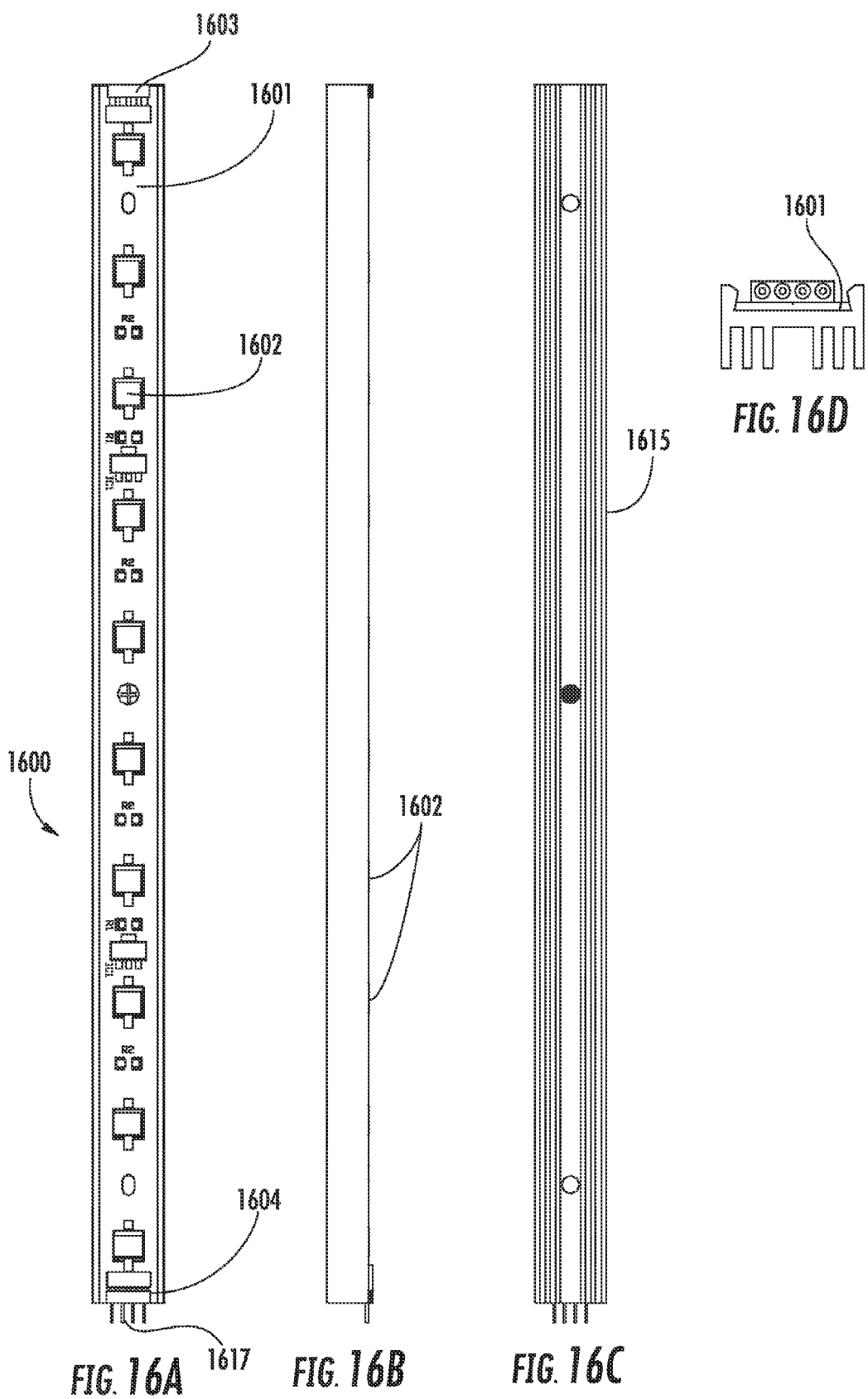
FIGS. 16A-D show various views of another embodiment of lighting strips according to the invention.

FIG. 12A shows a perspective view of an exemplary socket-type 1203 end of one lighting strip 1200 and a plug-type 1204 end of another strip 1200 unconnected, while FIG. 12B shows three lighting strips 1200 (lighting system) connected. As shown, the socket 1203 in this embodiment comprises a plug hole 1206, which provides for a releasable connection between the socket 1203 and plug 1204. In this embodiment, both the plug 1204 and socket 1203 comprise electrical contacts so that the electrical circuit of the substrate 1201 can be continued through the male and female connectors 1203, 1204 during use. Although not required, a releasable connection between the socket 1203 and plug 1204 ends is preferred, so that once a lighting system (one or more lighting strips capable of being interconnected) is installed, repairs and changes can be made quickly and easily by releasing the connection between components to exchange an installed component for a new or replacement component. A preferred embodiment for the releasable connection between socket 1203 and plug 1204 can be obtained by providing electrical contacts within plug hole 1206 at a position where friction fit with electrical contacts of the plug 1204 is made possible. One embodiment provides for the electrical contacts within the plug hole 1206 to be oriented at opposing sides of the hole 1206 and with just enough spacing between them to provide for direct physical and friction fit contact between contacts of the plug hole 1206 and plug 1204 when the plug 1204 is inserted into the hole 1206 of the socket 1203. In embodiments, the connectors 1203, 1204 can be configured to be connected at installation but permanently or otherwise difficult to disconnect once installed, such as by soldering the components together or by using a latch-type engagement. Here, socket 1203 comprises structure 1212 capable of engaging hole 1213 of plug end 1204. Once engaged, prongs 1212 and holes 1213 on either sides of their respective connector ends can be disengaged by pressing the prong 1212 back out of hole 1213. The latch 1212, 1213 is one type of quick-release latch that can be used. Changes or repairs to an installed lighting system are more convenient when there is no latch or a quick-release latch connecting the components. Also, in this embodiment the female end 1203 is integrally formed with the rigid lighting strip 1200 preferably at one lengthwise end of each strip 1200, while the male end 1204 is integral with the opposing end of strip 1200. As shown, screws 1214 are used to combine these connector ends to the strip 1200 at the heat sink 1215 and electrical connections between the connectors 1203, 1204 and the substrate 1201 are also integral to permit completion of the electrical pathway between lighting strips 1200. Any equivalent means of mounting the connectors 1203, 1204 would be acceptable.

Embodiments of the invention include plugs 1204 and sockets 1203 that provide for co-planar, parallel, or perpendicular interconnection of the lighting strips 1200, including any plug 1204 and plug hole 1206 orientation relative to the substrate 1201. The embodiments of FIGS. 12A and 12B, which show plug holes 1206 in a plane that lies parallel to the plane of the substrate 1201 and heat sink 1215 to which the socket 1203 is attached, provide for interconnection of lighting strips 1200 in a manner that allows for one substrate 1201 to be in one plane and a subsequent interconnected substrate 1201 to be in another parallel plane. FIG. 12B represents this parallel arrangement well. Other examples of lighting strip 1200 orientation include where the lighting strips 1200 (the terms lighting strip and substrate may be used interchangeably in this application to refer to the overall lighting device or the support to which LEDs are mounted) and are interconnected in a manner that provides for a perpendicular arrangement. One way to achieve this is to have plug hole 1206 facing upward (in the same direction as the upper surface of the lighting device 1200) so that when a subsequent strip 1200 is connected to the first, they can lie in planes that are perpendicular to one another. Such a configuration would make it easier to apply the lighting strips 1200 to a surface that has a 90° corner, e.g., inside a window frame.

FIGS. 12C and 12D provide an example of a lighting strip with 60 LEDs.

FIGS. 13A and 13B provide an embodiment of an adapter for connecting the lighting strips 1300 to a power source. As shown, the connection to the power source can be made by way of wire leads 1309 that can be permanently secured to the adapter 1316 (or directly to a substrate 1301 or other intermediate electrical pathway, if no adapter is used), which lead to a power source. FIG. 13A provides a perspective view of the socket-type connector 1303 of the adapter 1316 and FIG. 13B provides the corresponding view of the complementary plug-type connector 1304 of the lighting strip 1300 (either the lighting strip 1300 or the adapter 1316 can comprise either type socket-type 1303 or plug-type end 1304), showing complementary plug holes 1306 and plugs or prongs 1317.

FIGS. 14A-I show various views of components of an embodiment of the lighting systems 1400 according to the invention. As shown, lighting strip 1400 comprises wire leads 1409 for connection to a power source. The wire leads 1409 are permanently attached to an adapter 1416 or directly to the strip 1400 and provide electrical power to flow through the electrical circuit of strip 1400. The adapter 1416 comprises structure for engaging and connecting with strip 1400, namely prongs 1412 or holes 1413, which interact with a corresponding element on strip 1400. Each lighting strip 1400 comprises a male and female end 1404, 1403 (attached by way of securing means, such as screws 1414 in this embodiment), which respectively comprise electrical contact prongs 1417 or plug holes 1406 for releasable, friction-fit engagement. Lighting strips 1400 can further comprise heat sink 1415 and/or support 1419. Support, or hanging board 1419, can be used as an intermediate structure for supporting the lighting strips 1400 during use on a surface. In this embodiment, support 1419 is screwed to a surface, while once installed the lighting strips can be engaged or disengaged with the quick-release support mechanism of the support 1419 to make repairs and installation more convenient. Embodiments may include a transparent cover 1418 for protection of substrate 1401 and optoelectrical components of the system. One embodiment of the cover 1418 can comprise clear colored and transparent plastic. Cover 1418, as shown, can have a contoured surface and/or can function as a lens for directing or otherwise controlling light from light sources 1402. The contoured surface can be continued throughout the lighting strip system in the connectors 1403, 1404 to ensure a secure yet releasable fit between the components. This embodiment is an example of a non-waterproof lighting strip according to the invention. A preferred embodiment of the rigid lighting strips according to the invention is a non-waterproof system, comprising lighting strips 1400 having a substrate strip housing 1415 (which may or may not have heat sink capabilities), wherein the substrate strip, typically a PCB 1401 with multiple LEDs 1402, can be slideably engaged with the housing 1415 for ease of manufacturing. A housing cover 1418 can also be included, which can have a contoured surface for maintaining some clearance over LEDs 1402, yet provide for an overall low profile device. The cover 1418 is preferably also slideably engagable with the housing 1415 and during manufacturing can be inserted separately or simultaneously into housing 1415 with substrate 1401. Connectors 1403, 1404 have an interior profile complementary to housing 1415 and cover 1418 to which the connectors are integrally formed (by screws 1414, adhesive, solder, or other difficult to release type securing means. The overall device 1400 of this embodiment has a compact configuration and is low profile due to its unique shape. For installing the lighting strips 1400 to a surface, a hanging board 1419 is provided. This support 1419 can be secured to a surface by way of adhesive or screws for example and the lighting strips 1400 inserted, removed, and re-inserted at the installer's convenience. The hanging board 1419 in this embodiment comprises snap-fit type securing means, which provides for quick-release of the lighting device from the surface to which it is installed.

FIGS. 15A, 15B, 15C, 15D, and 15E show various views of a waterproof lighting system according to the invention. In this embodiment, high brightness 0.5 W SMD PLCC-6 LEDs can be used for the light sources 1502. The LEDs 1502 are mounted to a substrate 1501, which is supported by support 1515. Lighting strips 1500 of this embodiment can be of any length, with 1-, 2-, or 3-foot segments being preferred. The strips 1500 are connected to a power source by wire leads 1509, which exit the lighting strip at hole 1520. A waterproofing substance 1523 can fill the area around the LEDs 1502. The wire leads 1509 can comprise insulation or other waterproofing material to completely fill the hole 1520 and thereby waterproof the strip 1500. The lighting strips can be mounted to a surface by way of holes 1521 in support 1522, through which screws or any other attaching mechanism can be used. Substrate 1501 can be secured to housing 1515 by way of screws 1514.

FIGS. 16A, 16B, 16C, and 16D show various views of another embodiment of lighting strips 1600 according to the invention. The lighting strips 1600 in this embodiment are non-waterproof. In FIGS. 16A-D, heat sink housing 1615 supports substrate 1601 in a slideably engagable manner similar to that in FIGS. 15A-E. LEDs 1602 have a profile that is at or near the height of the sides of housing 1615. To connect strips 1600 to one another plug prongs (electrical contacts) 1617 are provided, which are integral (in this case soldered) to one end of strip 1600 and operably connected to the circuit of the substrate 1601. Corresponding socket-type end 1603 is provided with complementary internal structure (plug holes) at the opposing lengthwise end for interconnection of the male and female ends 1603, 1604.

Figure 17:
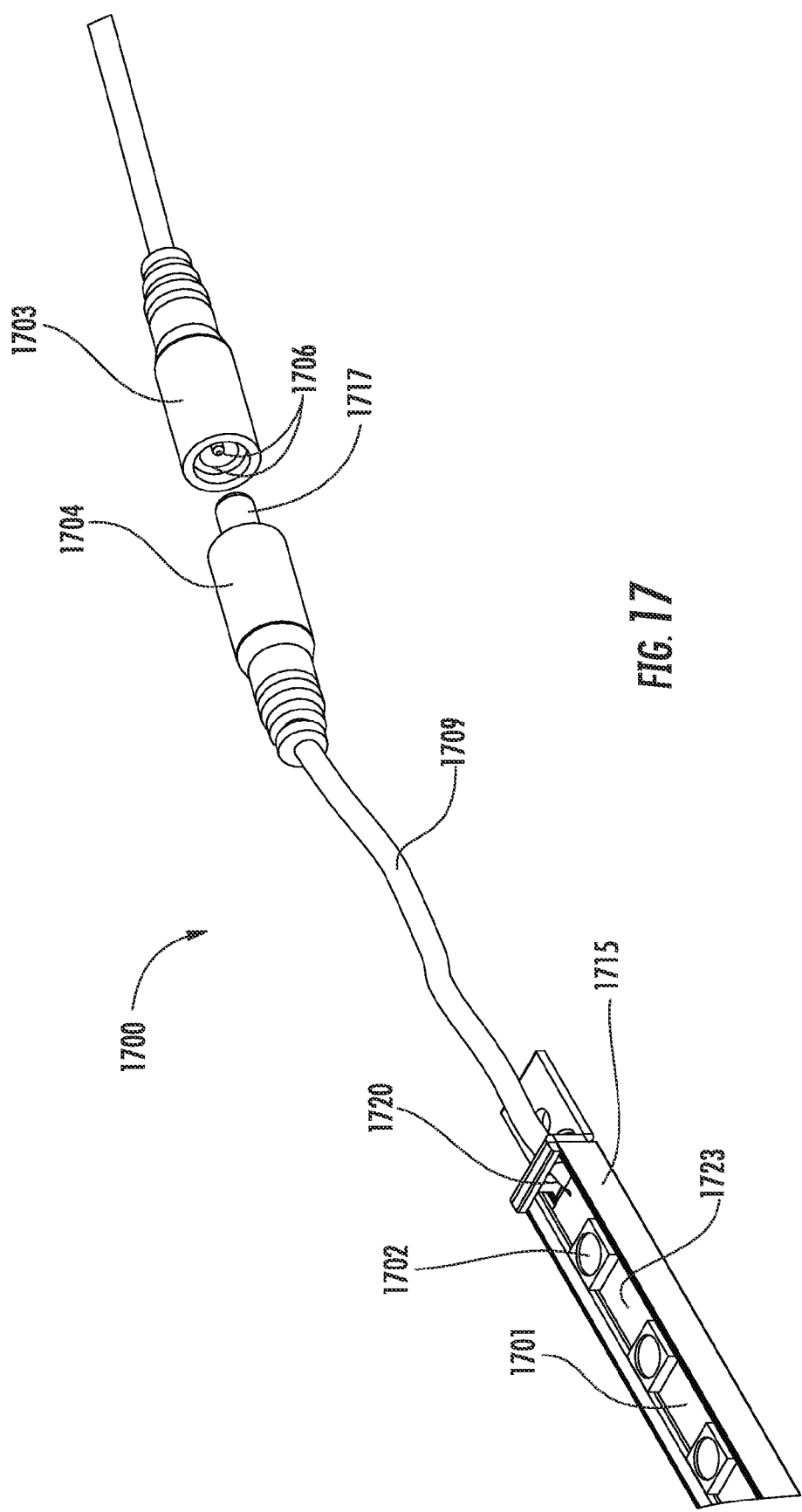
FIG. 17 shows another waterproof embodiment of lighting strips according to the invention, similar to that shown in FIGS. 15A-E.

FIG. 17 shows another waterproof embodiment similar to that shown in FIGS. 15A-E. Here, lighting strip 1700 comprises a housing 1715 for supporting substrate 1701. Mounted onto substrate 1701 are at least one LED 1702. Insulated wire leads 1709 are attached to the substrate 1701 in an operable fashion to permit the flow of electricity from the power source through the circuit of the PCB, through wire leads at the opposing end of strip 1700, and into a subsequent lighting strip 1700 operably connected in the lighting strip series. Socket-type end 1703 comprises structure 1706 for engaging and operably connecting with complementary structure 1717 of plug-type end 1704. The connectors 1703, 1704 in this embodiment provide for a waterproof, releasable engagement with a friction-fit. Additionally, waterproofing material 1723 is added to lighting strip 1700 to cover the LEDs 1702 and substrate 1701 and fill the holes 1720 through which wire leads 1709 exit the lighting strip 1700. The waterproofing material can be a resin or epoxy or any suitable material that does not interfere with operation of the light sources 1702, e.g., transparent.

The lighting devices of the present invention can be dimmable and/or programmable so as to provide color mixing, a chasing circuit, flashing, etc. Further, the light strips can operate at voltages of 12 or 24 VDC. To keep the electrical current consistent during operation, integrated circuits, transistors, and/or resistors can be used. For example, with the 24 VDC flex strips, integrated circuits (ICs) can be used, typically incorporated onto the PCB at predetermined intervals between the LEDs. In one embodiment of the 24 VDC flex strips, and depending on the color of the LEDs, one IC can be used for every 6 LEDs (for white, blue, and green) or one IC can be used for every 9 LEDs (for red and yellow). Likewise, for example, resistors can be used with the 12 VDC flex strips.

The lighting systems and strip lighting devices of the present invention are useful in many applications where strip-type lighting can be used. For example, the lighting devices and systems according to the invention can be used in any residential or commercial application where such lighting is desired for decoration, backlighting or functional lighting, including for aisle, path, and contour lighting, such as in theatres, hospitals, airplanes, concert halls, stadiums, and auditoriums; elegant interior decoration, such as in restaurants, nightclubs, casinos, piers, malls, streets, stations, stages, offices and lobbies; homes, including as accent lighting in living rooms, under cabinet lighting in kitchens, backlighting in display cases and shelving systems, functional and decorative lighting in entryways and recreational rooms; seasonal applications, such as for holiday decorations or landscape lighting; automobiles; architectural lighting, even including tent or canopy lighting; signal lighting; and backlighting larger size signs. The applications mentioned are merely representative of the numerous applications for which the lighting systems and strip lighting devices of the present invention may be applicable.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. Other embodiments of the invention will be apparent to those skilled in the art from consideration of the specification and practice of the invention. It is intended that the specification and examples be considered as exemplary in nature and that variations that do not depart from the essence of the invention are intended to be within the scope of the invention.

The invention claimed is:

1. A modular lighting strip comprising:
 a non-conductive substrate strip comprising an electrical circuit of at least two electrically conductive planar strips with edges disposed parallel to one another lengthwise along the substrate strip;

a plurality of light sources operably connected to the electrical circuit;
a male plug at one end of the substrate strip, wherein the plug is formed from one end and from an upper exposed surface of the conductive planar strips; and
a female socket at an opposing end of the substrate strip;
wherein the plug and socket provide for removable, friction-fit, and electrical interconnection of two or more circuits; and
wherein the plug and socket are integrally formed as part of the lighting strip provided as a single unit.

2. The modular lighting strip according to claim 1, wherein the plug and socket are capable of latchless engagement.

3. The modular lighting strip according to claim 2 which is flexible.

4. The modular lighting strip according to claim 1 which is rigid.

5. The modular lighting strip according to claim 1, wherein:
the substrate strip is flexible;
the light sources are light emitting diodes (LEDs);
the plug is formed by electrical contacts mounted to an end of the substrate strip and operably connected to the electrical circuit; and
the socket is mounted to an opposing end of the substrate strip and comprises a plug hole with internal electrical contacts operably connected to the electrical circuit;
wherein the plug and plug hole are oriented lengthwise in relation to the substrate strip and have complementary shapes and provide for latchless interconnection of two or more substrates.

6. The modular lighting strip according to claim 5, wherein the substrate strip comprising an electrical circuit is a flexible printed circuit board.

7. The modular lighting strip according to claim 6 which is low profile having a height of less than about 3 mm.

8. The modular lighting strip according to claim 7 capable of being cut during installation of the lighting strip to provide less than 1 foot of lighting strip or fewer LEDs than on the strip.

9. The modular lighting strip according to claim 7 which is about 1 foot long, comprises from about 6-18 LEDs, and is capable of being operably interconnected to provide up to 540 light sources from one electrical power supply.

10. A connector assembly for printed circuit boards (PCBs) comprising:
a plug at one end of a PCB; and
a socket, with a plug hole, at an opposing end of the PCB;
wherein the PCB comprises an electrical circuit of at least two electrically conductive planar strips with edges disposed parallel to one another lengthwise along the substrate strip;
wherein the plug is a male plug formed from one end and from an upper exposed surface of the conductive planar strips;
wherein the plug and plug hole are oriented lengthwise in relation to the substrate strip and are capable of providing removable, friction-fit, and electrical interconnection of two or more PCBs; and
wherein the plug and socket are integrally formed as part of the lighting strip provided as a single unit.

11. The connector assembly according to claim 10, wherein the plug and socket are capable of latchless engagement.

12. The connector assembly according to claim 11, wherein:
the plug is formed by electrical contacts mounted to an end of the PCB and operably connected to the PCB; and
the socket is mounted to an opposing end of the PCB and comprises a plug hole with internal electrical contacts operably connected to the PCB.

13. The connector assembly according to claim 12, wherein the PCB is a flexible printed circuit board.

14. The connector assembly according to claim 13, wherein the socket is low profile having a height of less than about 3 mm.

15. The connector assembly according to claim 14 capable of being cut during installation to provide a termination point in the circuit.

16. A modular lighting system comprising:
a plurality of modular lighting strips each comprising:
a non-conductive substrate strip comprising an electrical circuit of at least two electrically conductive planar strips with edges disposed parallel to one another lengthwise along the substrate strip;
a plurality of light sources operably connected to the electrical circuit;
a male plug at one end of the substrate strip, wherein the plug is formed from one end and from an upper exposed surface of the conductive planar strips; and
a socket at an opposing end of the substrate strip;
wherein the plug and socket are integrally formed as part of the lighting strip provided as a single unit;
wherein the plug and socket provide for removable, friction-fit, and electrical interconnection of two or more circuits; and
means for operably connecting a modular lighting strip to an electrical power supply for providing power to the light sources.

17. The modular lighting system according to claim 16, wherein the plug and socket are capable of latchless engagement.

18. The modular lighting system according to claim 17, wherein each modular lighting strip is low profile having a height of less than about 3 mm.

19. The modular lighting system according to claim 16, wherein the means for operably connecting a modular lighting strip to an electrical power supply is provided by the plug or socket of the lighting strip, wire leads operably connected to the lighting strip and the power supply, whether directly or indirectly by way of an adapter or controller, or a non-conductive substrate strip comprising an electrical circuit and no light sources which is capable of operably connecting to a lighting strip.

20. The modular lighting system according to claim 16, wherein each modular lighting strip is about 1 foot long, comprises from about 6-18 light emitting diodes as the light sources, and is operably interconnectable to provide from about 4-30 feet of strip lighting capable of being powered by one electrical power supply.

21. A modular lighting system comprising:
at least one first printed circuit board (PCB), optionally comprising at least one operably mounted light emitting diode (LED), wherein the first PCB is capable of being operably connected to a power supply and to a second PCB;
at least one second PCB with at least one operably mounted LED, which is capable of being operably connected to the first PCB and optionally operably connected to a third PCB;

one socket and one plug, integrally formed on a PCB for operably connecting two consecutive PCBs and as part of the PCB provided as a single units;

wherein the PCB comprises an electrical circuit of at least two electrically conductive planar strips with edges disposed parallel to one another lengthwise along the substrate strip;

wherein the plug is a male plug formed from one end and from an upper exposed surface of the conductive planar strips.

22. The modular lighting system according to claim 21, wherein the first PCB is capable of being connected to a power supply by way of a plug, socket, or wire leads irremovably and operably connected to the first PCB for connecting directly or indirectly by way of an adapter or controller to the power supply.

23. The modular lighting system according to claim 21, wherein each PCB with LEDs is about 1 foot long, comprises from about 6-18 LEDs, and is operably interconnectable to provide from about 4-30 feet of strip lighting capable of being powered by one electrical power supply.

24. The modular lighting system according to claim 21, wherein each PCB with LED is low profile having a height of less than about 3 mm.

* * * * *